US011664254B2

(12) United States Patent
Watanabe et al.

(10) Patent No.: US 11,664,254 B2
(45) Date of Patent: May 30, 2023

(54) SUBSTRATE PROCESSING APPARATUS AND SUBSTRATE PROCESSING METHOD

(71) Applicant: Tokyo Electron Limited, Tokyo (JP)

(72) Inventors: Tsuyoshi Watanabe, Kumamoto (JP); Masashi Tsuchiyama, Kumamoto (JP); Suguru Enokida, Kumamoto (JP); Taro Yamamoto, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 7 days.

(21) Appl. No.: 17/530,581

(22) Filed: Nov. 19, 2021

(65) Prior Publication Data
US 2022/0165596 A1    May 26, 2022

(30) Foreign Application Priority Data
Nov. 25, 2020    (JP) .............................. JP2020-195437

(51) Int. Cl.
*H01L 21/677*    (2006.01)
*H01L 21/67*    (2006.01)
(Continued)

(52) U.S. Cl.
CPC .......... *H01L 21/67712* (2013.01); *G03F 7/16* (2013.01); *H01L 21/6719* (2013.01); *H01L 21/67715* (2013.01); *H01L 21/6838* (2013.01)

(58) Field of Classification Search
CPC ..... B25J 9/042; B25J 9/043; H01L 21/67712; H01L 21/6719; H01L 21/67715;
(Continued)

(56) References Cited

U.S. PATENT DOCUMENTS 5,004,399 A * 4/1991 Sullivan .................. H01L 21/68
414/416.03
6,481,951 B1 * 11/2002 Shanmugasundram .....................
H01L 21/67742
414/935
(Continued)

FOREIGN PATENT DOCUMENTS

JP    2003264215 A *  9/2003
JP    2016208004 A    12/2016

*Primary Examiner* — Gerald McClain
(74) *Attorney, Agent, or Firm* — Nath, Goldberg & Meyer; Jerald L. Meyer; Tanya E. Harkins

(57) ABSTRACT

A substrate processing apparatus includes a carrier block on which a carrier configured to store a substrate is placed, first processing block including a plurality of first processing modules, and a first transport mechanism shared by the plurality of first processing modules to transport the substrate, second processing block overlapping the first processing block, including a plurality of second processing modules, and a second transport mechanism shared by the plurality of second processing modules to transport the substrate, and configured to transport the substrate to the carrier block. The substrate processing apparatus includes a lifting and transferring mechanism including a shaft extending in a horizontal direction and a support part configured to face and support the substrate, and a rotation mechanism configured to rotate the support part around the shaft such that an orientation of the support part is changed between a first orientation and the second position.

12 Claims, 18 Drawing Sheets

(51) Int. Cl.
  *G03F 7/16* (2006.01)
  *H01L 21/683* (2006.01)
(58) Field of Classification Search
  CPC ........... H01L 21/6838; H01L 21/67718; H01L 21/67733; H01L 21/67155; H01L 21/67161; H01L 21/67167; H01L 21/67173; H01L 21/67178; H01L 21/67184; H01L 21/67196
  USPC ......................................................... 414/281
  See application file for complete search history.

(56) References Cited

U.S. PATENT DOCUMENTS

| | | | | |
|---|---|---|---|---|
| 9,929,034 B2 * | 3/2018 | Goto | ................ | H01L 21/67778 |
| 2009/0263215 A1 * | 10/2009 | Hudgens | ........... | H01L 21/67742 |
| | | | | 414/222.01 |
| 2014/0003891 A1 * | 1/2014 | Kobayashi | ........ | H01L 21/67201 |
| | | | | 414/217 |
| 2017/0069517 A1 * | 3/2017 | Goto | ................ | H01L 21/67766 |
| 2018/0151399 A1 * | 5/2018 | Goto | ................ | H01L 21/68707 |
| 2018/0261490 A1 * | 9/2018 | Martin | ................ | B25J 17/0208 |
| 2021/0028043 A1 * | 1/2021 | Nakamura | ........ | H01L 21/68707 |

* cited by examiner

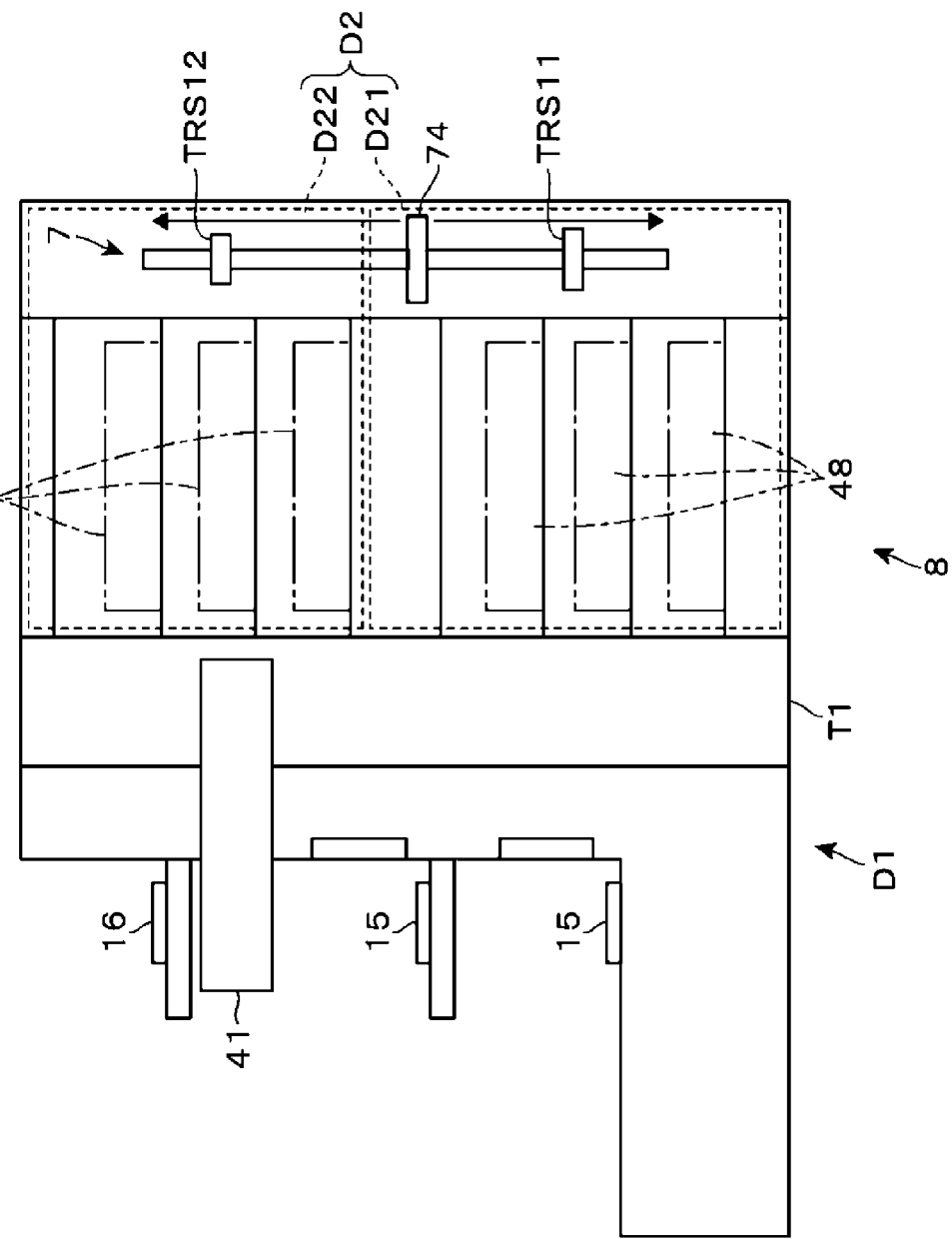

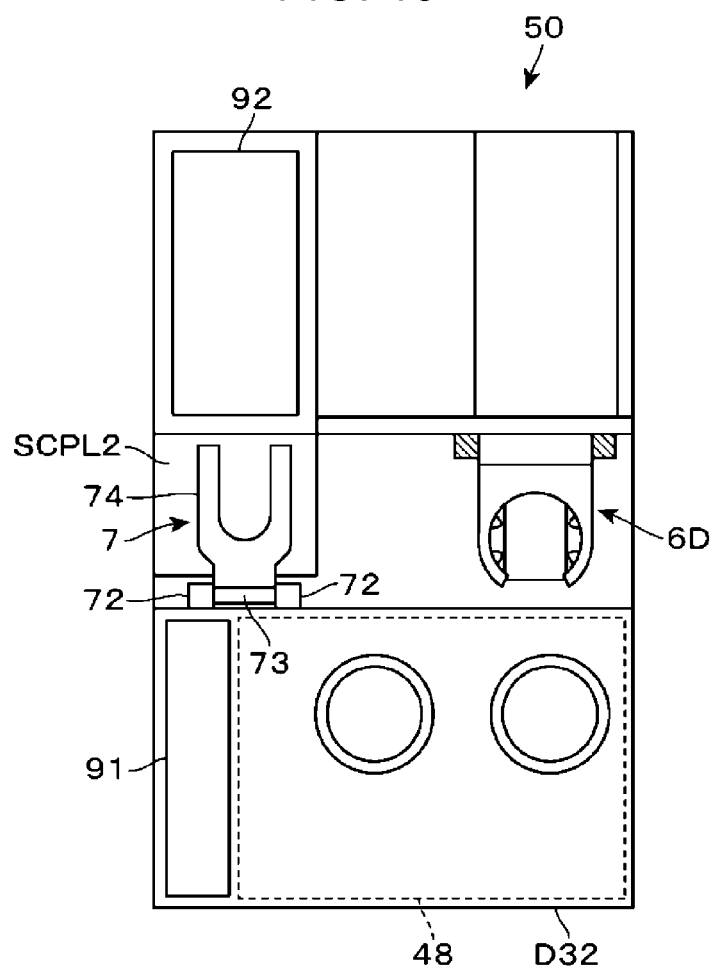

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2020-195437, filed on Nov. 25, 2020, the entire contents of which are incorporated herein by reference.

TECHNICAL FIELD

The present disclosure relates to a substrate processing apparatus and a substrate processing method.

BACKGROUND

In a semiconductor device manufacturing process, a semiconductor wafer (hereinafter referred to as a "wafer") is transported among various processing modules so that various processes such as a liquid process and a heating process are performed thereon. Patent Document 1 describes a coating apparatus including a plurality of unit blocks each of which is provided with a plurality of processing modules and which are stacked on one another, and processing blocks each of which includes a main arm provided for each unit block in order to transport a wafer among the processing modules. In this example, the coating apparatus is configured by stacking two layers of unit blocks for forming an SOC film, two layers of unit blocks for forming an antireflection film, and two layers of unit blocks for forming a resist film in this order from the bottom layer side. There is also described that a wafer is transported from the bottom layer to the top layer in the order of a unit block for forming an SOC film, a unit block for forming an antireflection film, and a unit block for forming a resist film to form three types of films in a laminated manner.

PRIOR ART DOCUMENT

Patent Document

Patent Document 1: Japanese Laid-Open Patent Publication No. 2016-208004

SUMMARY

According to embodiments of the present disclosure, there is provided a substrate processing apparatus including: a carrier block on which a carrier configured to store a substrate is placed; a first processing block including a plurality of first processing modules, each of which is configured to process the substrate, and a first transport mechanism shared by the plurality of first processing modules to transport the substrate, wherein the substrate is transported to the first processing block from the carrier block; a second processing block including a plurality of second processing modules, each of which is configured to process the substrate, and a second transport mechanism shared by the plurality of second processing modules to transport the substrate, wherein the second processing block overlaps the first processing block and is configured to transport the substrate to the carrier block; a lifting and transferring mechanism including a shaft extending in a horizontal direction and a support part including a support surface, which is configured to face and support the substrate, and extending from the shaft in a direction intersecting an extension direction of the shaft, wherein the lifting and transferring mechanism is configured to move the shaft and the support part upward and downward between a first position for delivering the substrate to the first transport mechanism and a second position for delivering the substrate to the second transport mechanism; and a rotation mechanism configured to rotate the support part around the shaft such that an orientation of the support part is changed between a first orientation for delivering the substrate at each of the first position and the second position and a second orientation in which the support surface has a lager slope with respect to a horizontal plane than a slope at the first orientation in order to move the support part between the first position and the second position.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 17 is a vertical sectional front view of the substrate processing apparatus.

FIG. 18 is an explanatory view illustrating another arrangement example of the lifting and transferring mechanism.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2:
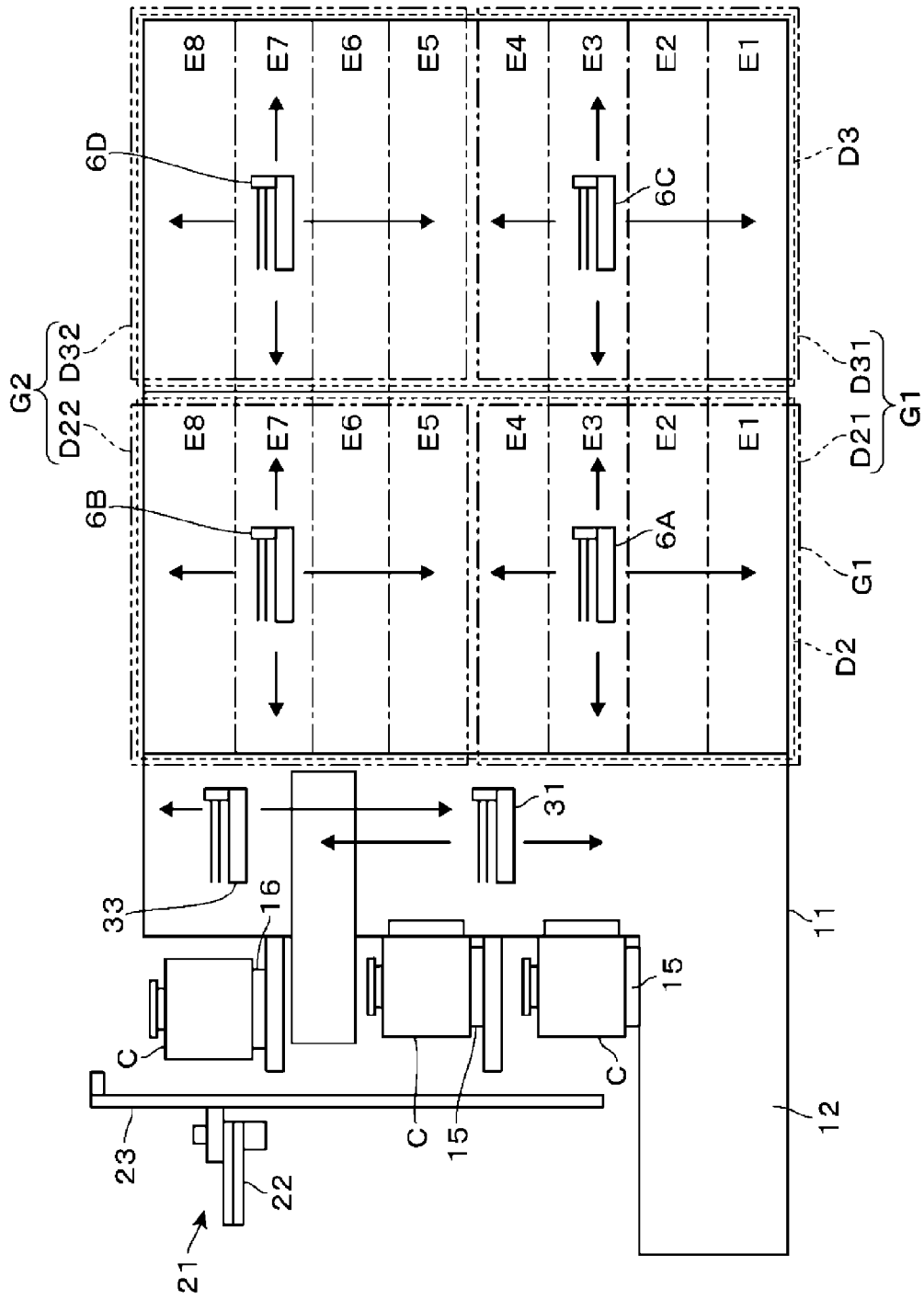
FIG. 2 is a vertical sectional front view of the substrate processing apparatus.
Figure 3:
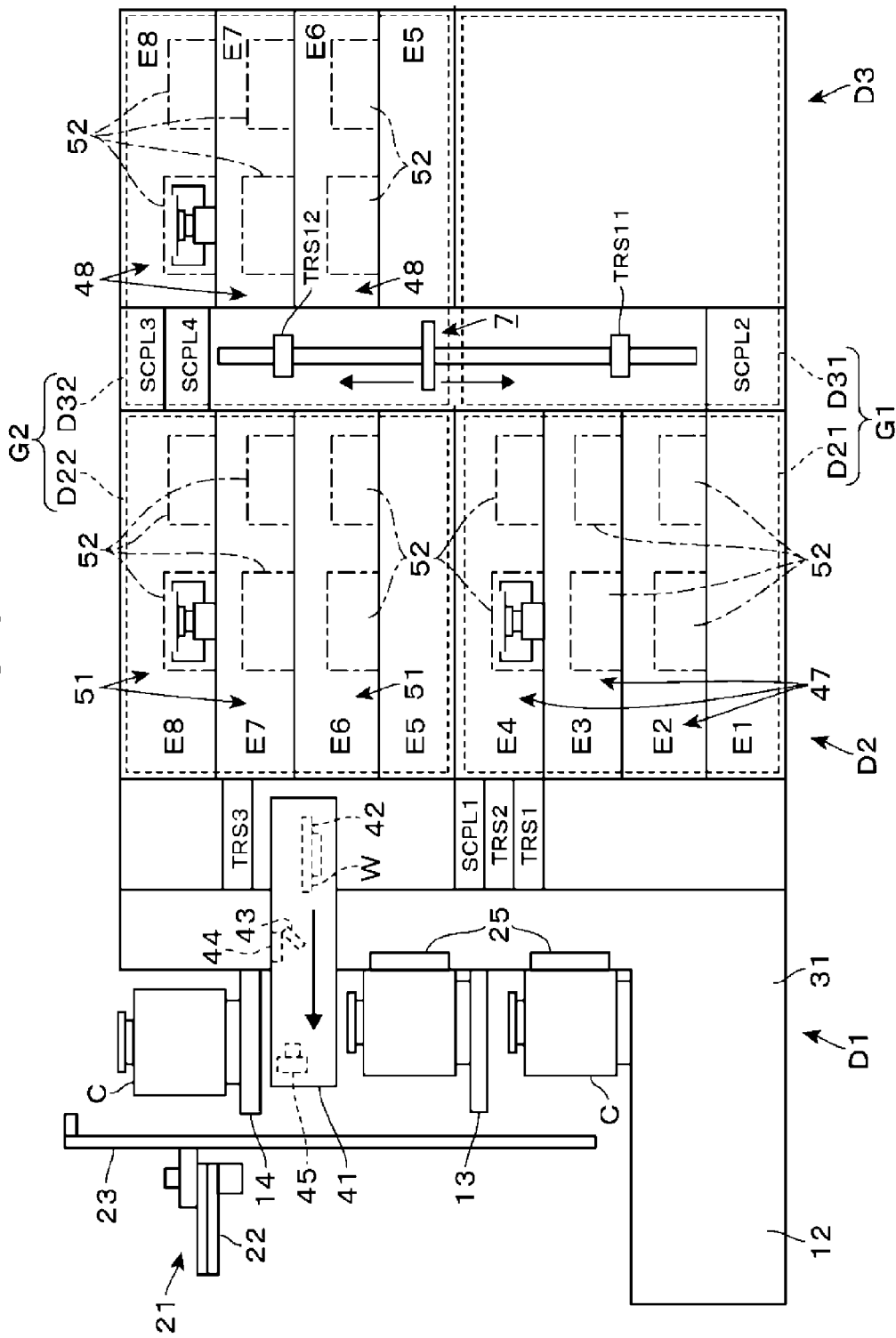
FIG. 3 is a vertical sectional front view of the substrate processing apparatus.

An example of a substrate processing apparatus 1 according to an embodiment of the present disclosure will be described with reference to each of a horizontal sectional plan view of FIG. 1 and vertical sectional front views of FIGS. 2 and 3. FIGS. 2 and 3 illustrate cross sections of the apparatus at different positions. In the substrate processing apparatus 1, a carrier block D1, a first processing block D2, and a second processing block D3 are arranged linearly in the horizontal direction in this order, and adjacent blocks are connected to each other. Each of these blocks (the carrier block and the first and second processing blocks) D1 to D3 includes a housing, so that the blocks are partitioned from each other, and a transport region for transporting a wafer W, which is a substrate, is formed inside each housing.

In the following description, the arrangement direction of these blocks D1 to D3 will be referred to as the left-right direction, the carrier block D1 side will be referred to as the left side, and the second processing block D3 side will be referred to as the right side. In addition, with respect to the front-rear direction of the apparatus, the front side when the carrier block D1 is viewed as the left side will be referred to the front side and the deep side will be referred to as the rear side.

Before describing each of the blocks D1 to D3 in detail, a schematic configuration of the substrate processing apparatus 1 will be described. A wafer W is transported to the substrate processing apparatus 1 in a state of being stored in a carrier C called, for example, a front opening unify pod (FOUP). The substrate processing apparatus 1 includes processing modules that perform various processes such as formation of a coating film by applying various coating liquids to a wafer W as part of liquid processing and heating of the wafer W after forming the coating film.

The first processing block D2 and the second processing block D3 are each partitioned so as to be divided into two in the vertical direction. The lower side and the upper side of the first processing block D2 that are partitioned from each other will be referred to as a first lower processing block D21 and a first upper processing block D22, respectively. In addition, the lower side and the upper side of the second processing block D3 that are partitioned from each other will be referred to as a second lower processing block D31 and a second upper processing block D32, respectively. Therefore, the first lower processing block D21 and the first upper processing block D22 are stacked on one another, and the second lower processing block D31 and the second upper processing block D32 are stacked on one another. Then, the first lower processing block D21 and the first upper processing block D22 are adjacent to each other, and the second lower processing block D31 and the second upper processing block D32 are adjacent to each other.

A wafer W is transported in the order of the carrier block D1, the first lower processing block D21, the second lower processing block D31, the second upper processing block D32, the first upper processing block D22, and the carrier block D1. Therefore, with reference to the carrier block D1, the first lower processing block D21 and the second lower processing block D31 form the outward path of the wafer W, and the first upper processing block D22 and the second upper processing block D32 form the return path of the wafer W. The lower processing blocks forming the outward path may be collectively described as a lower processing block G1, and the upper processing blocks forming the return path may be collectively described as an upper processing block G2.

Then, by being transported on the outward path and the return path in this way, three types of coating films are sequentially formed on the wafer W and laminated on one another. Of these coating films, the uppermost film will be described as a resist film, the film under the resist film will be described as an interlayer film, and the film under the interlayer film will be described as an underlayer film. The underlayer film is formed in the processing module on the outward path, and the interlayer film and the resist film are formed respectively in the processing modules on the return path. A module is a place on which a wafer W is placed other than a transport mechanism. A module that performs a process on a wafer W will be described as a processing module as described above, and this process also includes acquiring an image for inspection.

Figure 4:
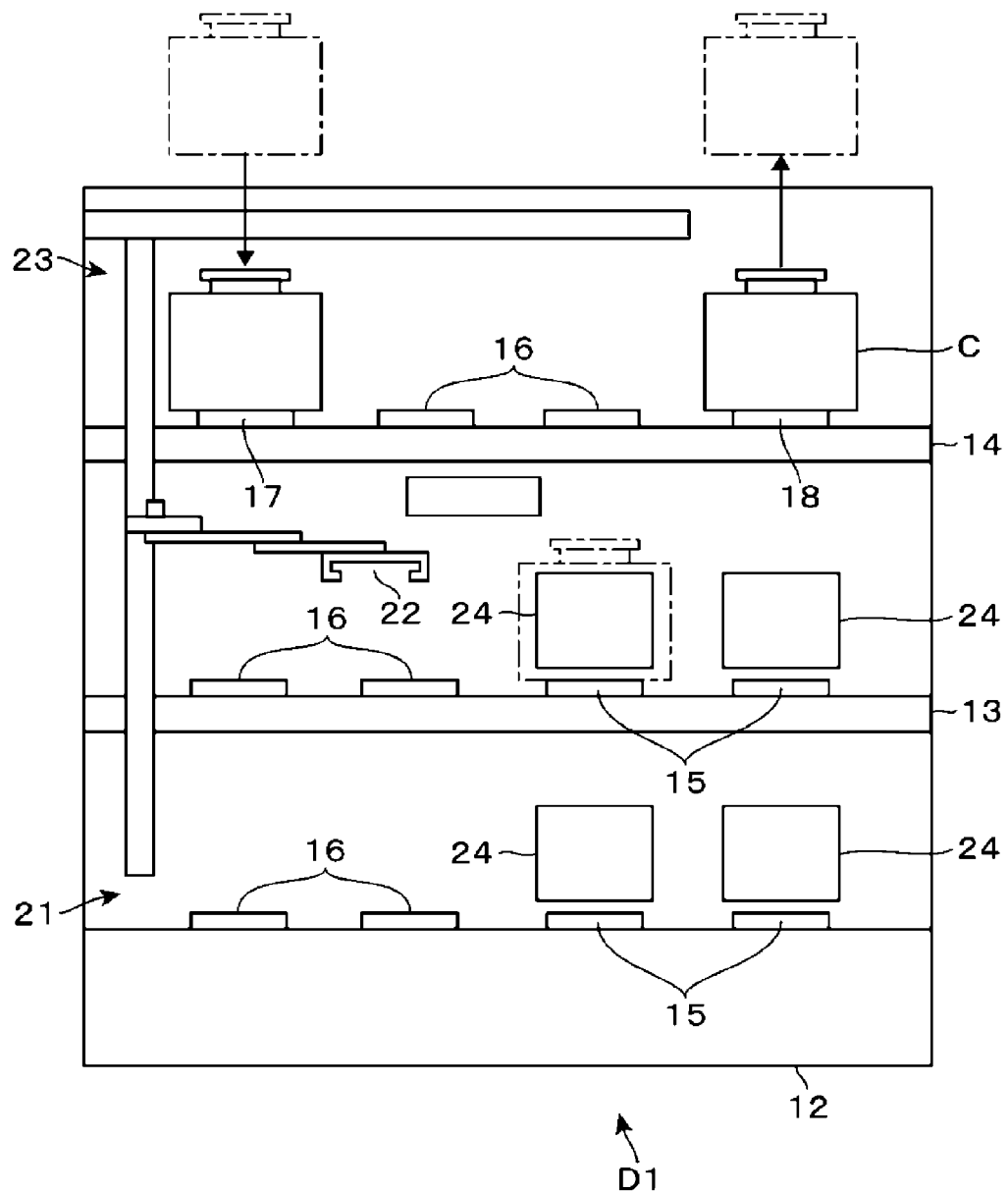
FIG. 4 is a left side view of the substrate processing apparatus.

Hereinafter, the carrier block D1 will be described with reference to the side view of FIG. 4 as well. A carrier C is carried into and out of the carrier block D1 by a carrier transport mechanism (an external transport mechanism) (not illustrated) provided in a clean room in which the substrate processing apparatus 1 is installed. The carrier block D1 is a block that performs carry-in/out of a wafer W with respect to the carrier C.

The above-mentioned housing forming the carrier block D1 will be denoted by reference numeral 11. The housing 11 is formed in a square shape, and the lower side thereof protrudes to the left to form a support base 12. In addition, on the left side surface of the housing 11 above the upper side of the support base 12, two positions separated from each other in the vertical direction protrude to the left to form the support bases 13 and 14, respectively. The lower support base and the upper support base will be denoted by reference numerals 13 and 14, respectively.

For example, it is possible to place four carriers C on each of the support bases 12 to 14 at intervals in the front-rear direction, each of the support bases is provided with stages on each of which a carrier C is placed in this manner, and the stages are arranged in, for example, a 3×4 matrix when viewed from the left. The left end of the support base 12 protrudes further to the left than the support bases 13 and 14, and the stages of the support base 12 are provided at the right side of the support base 12 below the support bases 13 and 14. As described above, the inside of the support base 12 is a region that stores bottles in which processing liquids for liquid processing in the first processing block D2 and the second processing block D3 are stored.

The carriers C can be transferred between respective stages by the carrier transfer mechanism 21 to be described later. Referring to each of the stages, two stages at the front side of the support bases 12 and 13 are configured as moving stages 15 on which the carriers C are placed in order to perform carry-in/out of wafers W with respect to the apparatus. Therefore, the moving stages 15 are arranged in a 2×2 matrix form when viewed from the left. The moving stages 15 move between a load position at the right side for performing carry-in/out of wafers W and an unload position at the left side for performing delivery of the carriers C to and/from the carrier transfer mechanism 21. In this example, the uses of the moving stages are distinguished as follows: the moving stages 15 of the support base 12 are used as stages (loaders) on which carriers C are placed, respectively, in order to dispense unprocessed wafers W into the apparatus, and the moving stages 15 of the support base 13 are used as stages (unloaders) on which carriers C are placed, respectively, in order to store wafers W processed in the apparatus. However, one moving stage 15 may be used as both a loader and an unloader.

Referring to other stages, two stages at the rear sides of the support bases 12 and 13 and two stages on the support base 14 are configured as temporary placement stages 16. In addition, the other two stages on the support base 14 are configured as a carry-in stage 17 and a carry-out stage 18, respectively. For example, the rear end side stage and the front end side stage of the support base 14 are a carry-in stage 17 and a carry-out stage 18, respectively. The carry-in stage 17 and the carry-out stage 18 are stages on which the carriers C are placed such that the above-described external transport mechanism performs carry-in and carry-out of the carriers C, respectively, with respect to the substrate processing apparatus 1.

The carriers C are transferred in the order of the carry-in stage 17, the moving stage 15 of the support base 12, the moving stage 15 of the support base 13, and the carry-out stage 18. In transferring the carrier C among the respective stages in this way, when a transfer destination stage is not empty (when the stage is occupied by another carrier C), the carrier C is placed on the temporary placement stage 16 and stands by until the transfer destination stage becomes empty.

A carrier transfer mechanism 21 is provided above the left side of the support base 12. The carrier transfer mechanism 21 includes an articulated arm 22 capable of holding a held portion provided on the upper portion of each carrier C, and a moving mechanism 23 capable of moving the articulated arm 22 upward and downward and rearward and forward so that the carrier transfer mechanism 21 can transfer the carrier C among the stages as described above.

Transport ports 24 configured to perform carry-in/out of wafers W therethrough are formed in the left wall of the housing 11 and are arranged in a 2×2 matrix form in accordance with the arrangement of the moving stages 15 described above. A door 25 is provided at each transport port 24. The door 25 is capable of holding the lid of the carrier C on the moving stage 15 at the loading position and capable of moving in the state of holding the lid to open/close the transport port 24.

The transport ports 24 face the transport region 31 for transporting a wafer W, wherein the transport region 31 is formed in the housing 11 in a straight-line shape that is long in the front-rear direction in a plan view. A transport mechanism 32 is provided on the front side of the transport region 31. The transport mechanism 32 includes a base that is capable of moving rearward and forward, capable of being raised and lowered, capable of being rotated around a vertical axis, and a wafer W holding part that is capable of moving rearward and forward on the base. The transport mechanism 32 is capable of accessing the carrier C on the moving stage 15 at the load position described above, a module-stacked body T1 to be described later, and the pre-processing inspection module 41 to perform a wafer delivery.

The carrier block D1 is provided with a pre-processing inspection module 41, and the pre-processing inspection module 41 images the surface of a wafer W before being processed by the substrate processing apparatus 1. Image data obtained by the imaging is transmitted to the controller 10 to be described later, and the controller 10 determines whether or not there is an abnormality in the wafer W based on the image data. The pre-processing inspection module 41 is configured in a flat rectangular parallelepiped shape that is elongated in a left-right direction. The right side of the pre-processing inspection module is located in the central portion in the front-rear direction of the transport region 31, and the left side of the pre-processing inspection module penetrates the left wall of the housing 11 and protrudes to the outside of the housing 11.

The pre-processing inspection module 41 includes a stage 42 movable in the left-right direction, a half mirror 43 provided above the moving path of the stage 42, an illumination part 44 configured to emit light downward via the half mirror 43, and a camera 45 provided on the left side of the half mirror 43 (see FIG. 3). A wafer W is delivered to the stage 42 located on the right side in the module by the transport mechanism 32. While the stage 42 to which the wafer W has been delivered moves to the left and passes under the half mirror 43, light is emitted to the stage 42 by the illumination part 44 and the wafer W reflected on the half mirror 43 is imaged by the camera 45, so the above-mentioned image data is acquired.

Figure 1:
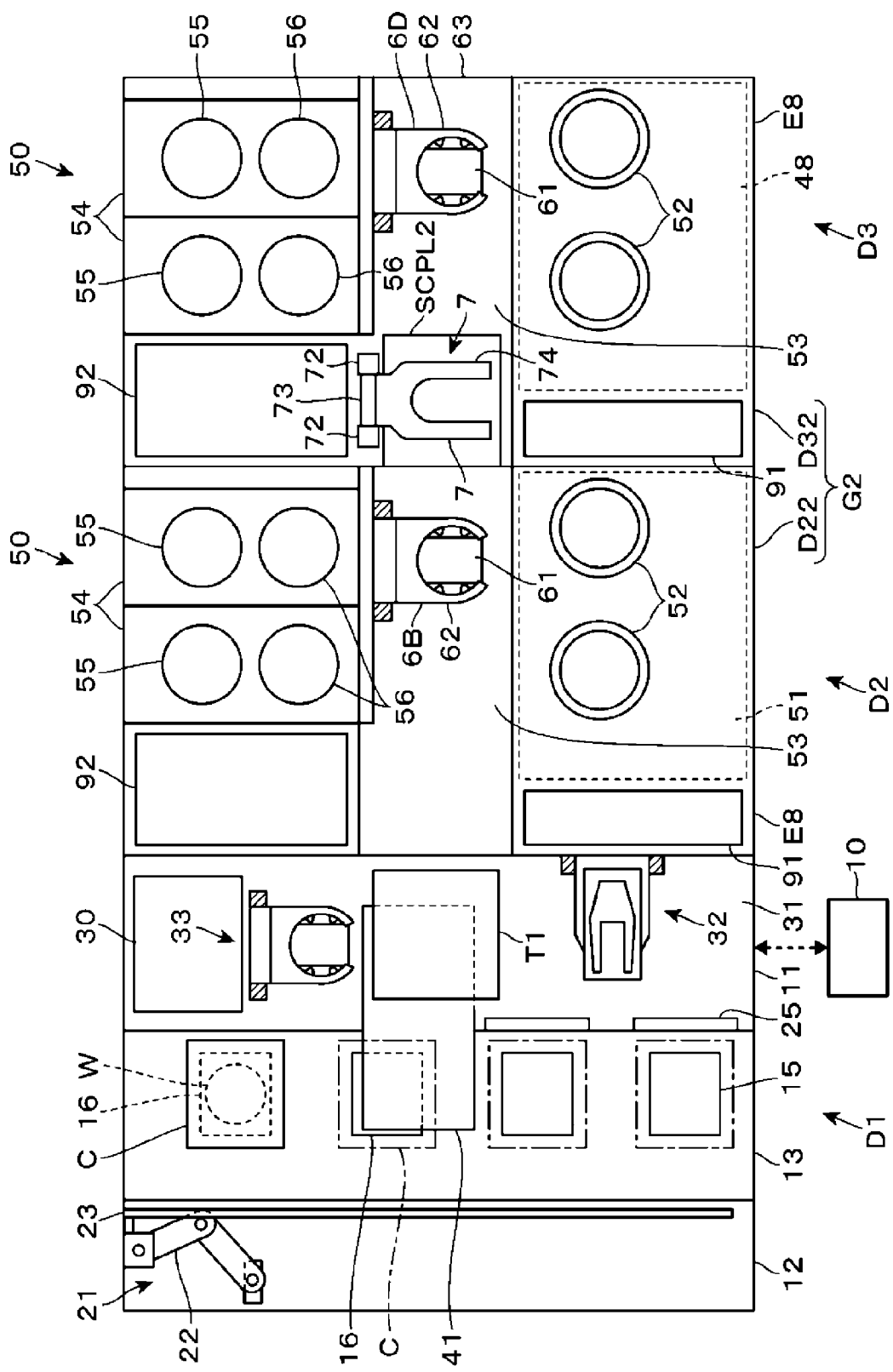
FIG. 1 is a horizontal sectional plan view of a substrate processing apparatus according to an embodiment of the present disclosure.

As illustrated in FIG. 1, in the transport region 31, a transport mechanism 33 is provided to be located behind the pre-processing inspection module 41 in a plan view. The transport mechanism 33 includes a base that is capable of being raised and lowered and is capable of rotating around a vertical axis, and a wafer W holding part that is capable of moving forward and backward on the base to deliver a wafer W to the module-stacked body T1 to be described later.

Subsequently, the module-stacked body T1 will be described. The module-stacked body T1 is configured such that a delivery module TRS, on which a wafer W is temporarily placed, and a temperature adjustment module SCPL are vertically overlapped each other, and is provided in the central portion of the front-rear direction of the transport region 31. Therefore, the module-stacked body T1 is sandwiched between the transport mechanisms 32 and 33 in the front-rear direction in a plan view and is disposed to overlap the right side of the pre-processing inspection module 41. The delivery module TRS is provided with, for example, a plurality of pins arranged in the horizontal direction, and a wafer W is delivered to the pins by the raising/lowering operation of a transport mechanism. The SCPL has a configuration in which a coolant flow path is connected to, for example, a plate configured to place a wafer W thereon so that a placed wafer W is cooled. The wafer W is delivered to the plate through the raising/lowering operation of the transport mechanism.

An SCPL is also provided in a block other than the carrier block D1, and the SCPL in the block other than the carrier block D1 has the same configuration as, for example, the SCPL in the carrier block D1. A TRS is also provided in a block other than the carrier block D1. Hereinafter, in order to distinguish SCPLs and TRSes at respective locations from each other, numbers are added after SCPL and TRS. For example, a plurality of TRSes and SCPLs are provided in a stacked manner at respective locations. That is, a plurality of TRSes and SCPLs having the same number are provided, but only one is illustrated for convenience of illustration. In the present specification, the term "stacked-module body" means modules provided to overlap each other in a plan view, and the modules may be spaced apart from each other or may be in contact with each other.

Some of the modules forming the module-stacked body T1 are provided under the pre-processing inspection module 41 and the others are provided above the pre-processing inspection module 41. For example, a TRS1, a TRS2, an SCPL1, and a TRS3 are provided in this order from the lower side to the upper side, and the pre-processing inspection module 41 is located between the SCPL1 and the TRS3 (see FIG. 3). For example, each of the TRS1, the TRS2, and the SCPL1 is located at the height of the first lower processing block D21, and the TRS3 is located at the height of the first upper processing block D22. The transport mechanism 33 is capable of accessing each module of the module-stacked body T1, and the transport mechanism 32 is capable of accessing the TRS1 and the TRS2.

The TRS1 and the TRS2 are used for delivering a wafer W between the transport mechanisms 32 and 33. The SCPL1 is used for delivering a wafer W between the first lower processing block D21 and the carrier block DE Therefore, the transport mechanism 6A of the first lower processing block D21, which will be described later, is also accessible to the SCPL1. In addition, the TRS3 is used for delivering a wafer W between the first upper processing block D22 and the carrier block DE Therefore, the transport mechanism 6B of the first upper processing block D22, which will be described later, is also accessible to the TRS3.

A hydrophobic processing module 30 is provided on the rear side of the transport mechanism 33 to supply a processing gas to a wafer W to perform hydrophobic processing before forming a coating film. For example, the hydrophobic processing module 30 is provided at the height of the second upper processing block D32, for example, in a stacked manner, and a delivery of the wafer W to/from the hydrophobic processing module 30 is performed by the transport mechanism 33. The hydrophobic processing module 30 includes a hot plate on which a wafer W is placed like the hot plate 55 provided in the heating module 54, which will be described later, and a cover that is capable of being raised and lowered and covers the hot plate. By supplying a processing gas to a closed space formed by the cover on the hot plate, hydrophobic processing is performed on the wafer W.

Figure 5:
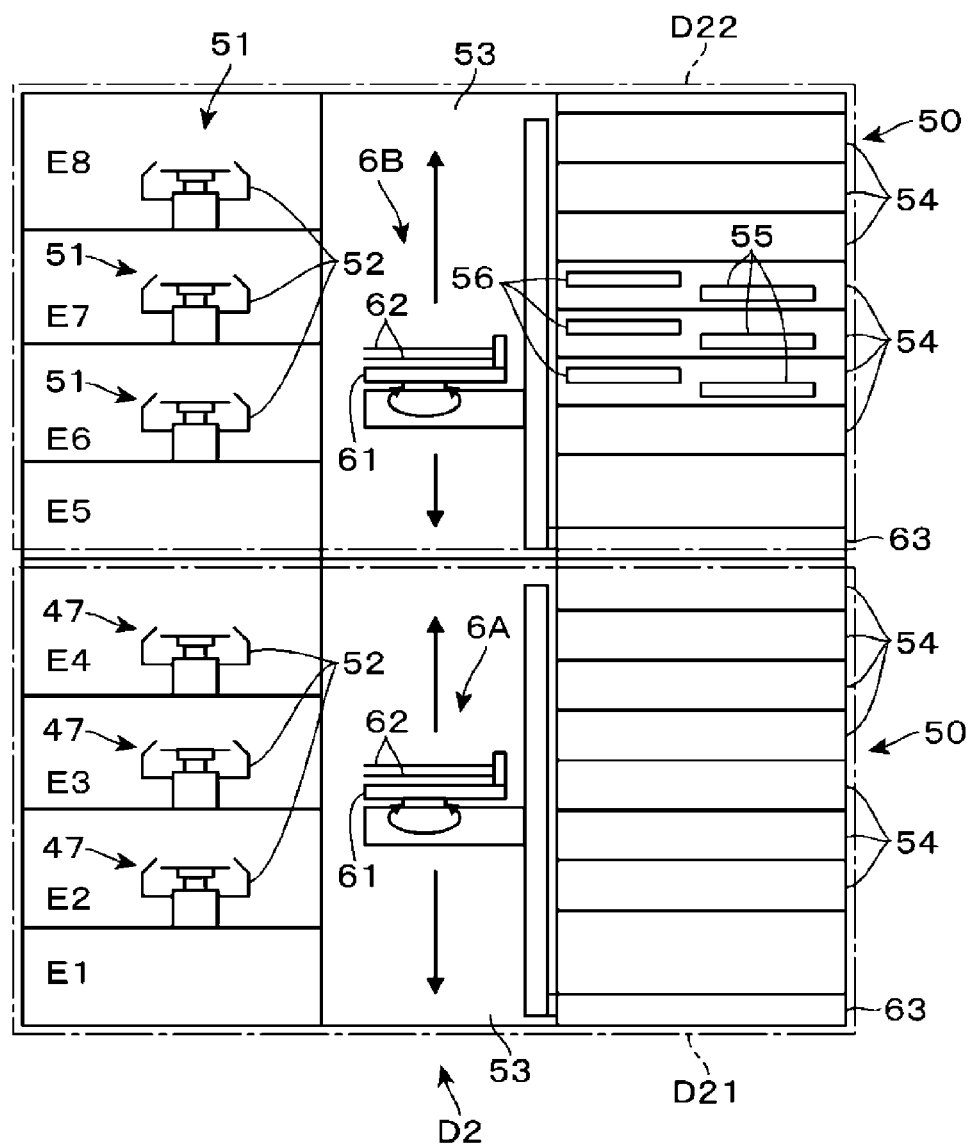
FIG. 5 is a vertical sectional side view of the substrate processing apparatus.

Subsequently, the first processing block D2 will be described with reference to FIG. 5, which is a vertical sectional side view. The front side of the first processing block D2 is divided in the vertical direction to form eight layers, and respective layers are denoted by reference numerals E1 to E8 from the lower side to the upper side. The lower layers E1 to E4 and the upper layers E5 to E8 are included in the first lower processing block D21 and the first upper processing block D22, respectively. Each layer forms a region in which a liquid processing module can be installed.

First, the first upper processing block D22 will be described. In each of the layers E5 to E8, a resist coating module 51 is provided as a liquid processing module. The resist coating module 51 includes two cups 52 arranged in the left-right direction and each accommodating a wafer W and a nozzle (not illustrated), and is configured to supply a resist liquid, which is supplied from the above-described bottle by a pump (not illustrated), to the surfaces of the wafer W to perform a process.

A wafer W transport region 53 is provided on the rear side of the layers E5 to E8 and is formed in a straight-line shape in a plan view from the left end to the right end of the upper processing block D22. Therefore, the extension direction of the transport region 53 is orthogonal to the extension direction of the transport region 31 in the carrier block D1. The transport region 53 is formed from the height of the layer E5 to the height of the layer E8. That is, the transport region 53 is not partitioned in the layers E5 to E8.

In the rear side of the transport region 53, processing modules are provided, for example, stacked in seven stages in the vertical direction, and two processing module-stacked bodies are arranged side by side in the left-right direction. That is, each of the processing module-stacked bodies and the cups 52 is provided along the extension direction of the transport region 53.

The processing module-stacked bodies arranged in the left-right direction will be referred to as rear processing parts 50. A plurality of heating modules 54 are included as processing modules forming the rear processing parts 50. The heating modules 54 in the first upper processing block D22 are modules for removing solvent in a coating film, and each includes a hot plate 55 on which a wafer W is placed to be heated and a cooling plate 56 for adjusting the temperature of the wafer W. The cooling plate 56 is movable between a front position at which a wafer W is delivered through the elevating operation of a transport mechanism 6B to be described later and a rear position at which the cooling plate 56 overlaps the hot plate 55. A wafer W is delivered between the hot plate 55 and the cooling plate 56 by the cooperation between the raising operation of pins (not illustrated) included in the hot plate 55 and the above-mentioned movement of the cooling plate 56.

The transport region 53, which is a main transport path, is provided with a transport mechanism 6B, which is a main transport mechanism described above, and the transport mechanism 6B includes a base 61 that is capable of moving leftward and rightward, capable of moving upward and downward, and capable of rotating around a vertical axis and a wafer W holding part 62 that is capable of moving forward and rearward on the base 61. In the substrate processing apparatus 1 including the transport mechanism 6B, each transport mechanism is provided with two holding parts such that the holding parts are capable of independently moving forward and rearward.

A moving mechanism 63 for moving the base 61 of the above-mentioned transport mechanism 6B leftward and rightward is provided below the rear processing part 50. The transport mechanism 6B is capable of delivering a wafer W to each processing module in the first upper processing block D22, the TRS3 in the carrier block D1, and the SCPLs in the second upper processing block D32 to be described later. Therefore, the transport mechanism 6B is shared by these modules.

Next, the first lower processing block D21 will be described. The first lower processing block D21 has substantially the same configuration as the above-described first upper processing block D22, and differences from the first upper processing block D22 will be mainly described below. The layer E1 is not provided with a liquid processing module, and the layers E2 to E4 are each provided with a chemical liquid coating module 47 for applying a chemical liquid for forming an underlayer film, as a liquid processing module. The chemical liquid coating module 47 has the same configuration as the resist coating module 51, except that the chemical liquid for forming an underlayer film is supplied instead of supplying the resist liquid from a nozzle.

The main transport mechanism provided in the transport region 53 is illustrated as a transport mechanism 6A and has the same configuration as the transport mechanism 6B described above. The transport mechanism 6A delivers a wafer W to each processing module in the first lower processing block D21, the SCPL1 in the module-stacked body T1 described above, and the SCPLs in the second lower processing block D31 to be described later.

Next, the second processing block D3 will be described. The second processing block D3 has substantially the same configuration as the first processing block D2, and differences from the first processing block D2 will be mainly described below. First, in the second upper processing block D32, the layer E5 is not provided with a processing module and the layers E6 to E8 is each provided with a chemical liquid coating module 48 for forming an interlayer film, as a liquid processing module. The chemical liquid coating module 48 has the same configuration as the resist coating module 51, except that a nozzle for supplying a chemical liquid for forming an interlayer film is provided, instead of supplying the resist liquid from the nozzle. The main transport mechanism in the second upper processing block D32 will be referred to as a transport mechanism 6D. The transport mechanism 6D is capable of delivering a wafer W to each module provided in the second upper processing block D32 including an SCPL and a TRS to be described later.

Next, the second lower processing block D31 will be described. The second lower processing block D31 is not provided with a liquid processing module. The second lower processing block D31 is provided with a rear processing part 50 including a heating module 54 in the same manner as other processing blocks D21, D22, and D32. The heating module 54 in the second lower processing block D31 is a module for curing an underlayer film by gradually heating the underlayer film with the heating module 54 in the first lower processing block D21. The main transport mechanism in the second lower processing block D31 will be referred to as a transport mechanism 6C. The transport mechanism 6C delivers a wafer W to each module provided in the second lower processing block D31 including an SCPL and a TRS to be described later.

Figure 6:
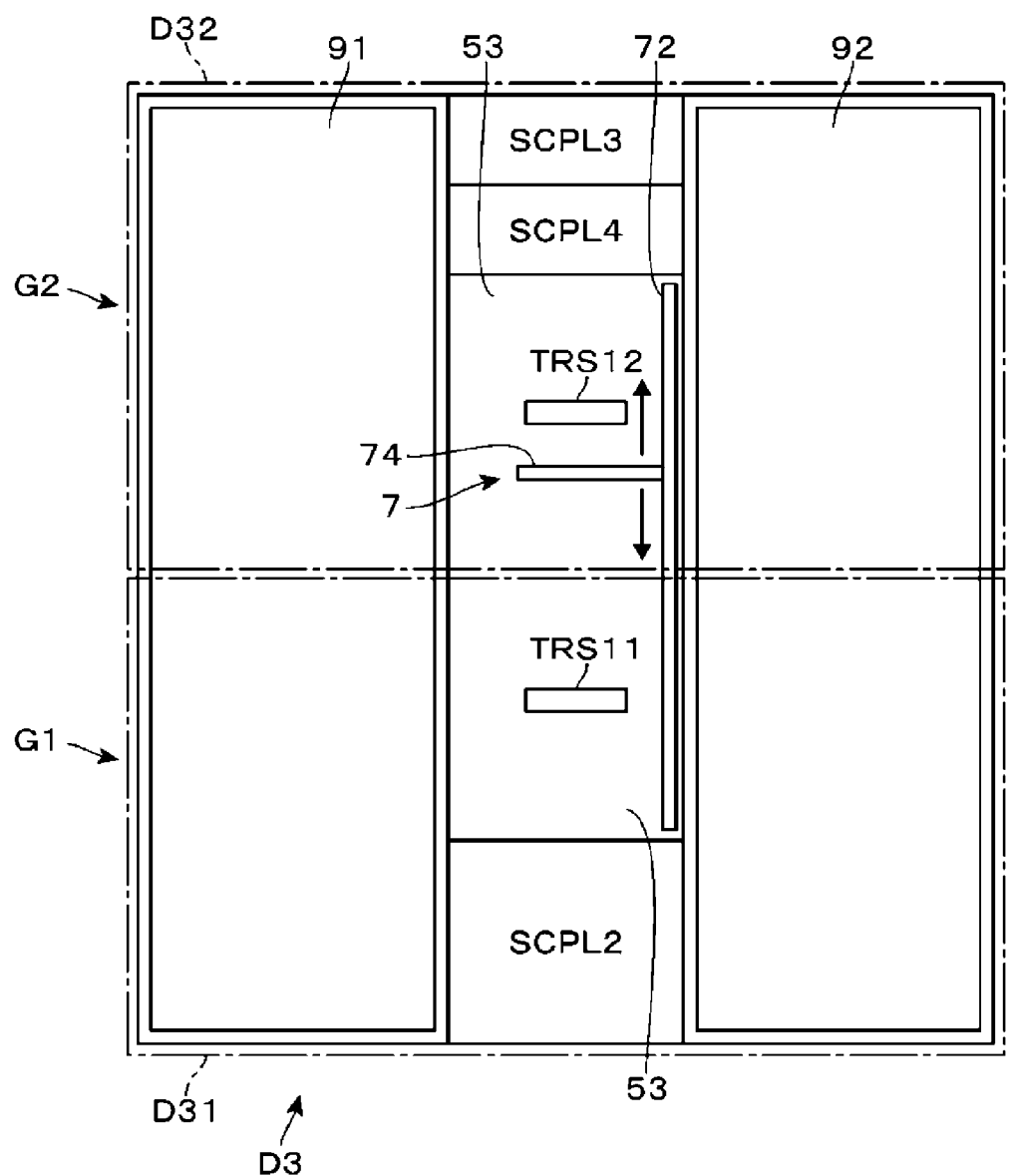
FIG. 6 is a vertical sectional side view of the substrate processing apparatus.

The left side of each liquid processing module in each of the first lower processing block D21, the first upper processing block D22, the second lower processing block D31, and the second upper processing block D32 described above is configured as an accessory facility installation region 91 for the liquid processing module. The accessory facility installation region 91 is located in front of the transport region 53 of each of the processing blocks D21, D22, D31, and D32, and is provided from the lower portion of the lower processing block G1 to the upper portion of the upper processing block G2. Therefore, the accessory facility installation region 91 is provided in each of the first processing block D2 and the second processing block D3, and the vertical sectional side view of FIG. 6 illustrates that the accessory facility installation region 91 is provided in the second processing block D3. In each of the accessory facility installation region 91 in the first processing block D2 and the accessory facility installation region 91 in the second processing block D3, an exhaust path, a drainage path, a power supply cable, and the like, which are connected to the liquid processing module in each processing block, are installed.

A region at the left side of the rear processing part 50 and the rear side of the transport region 53 in each of the processing blocks D21, D22, D31, and D32 is configured as an accessory facility installation region 92. Therefore, the accessory facility installation region 92 is also provided in each of the first processing block D2 and the second processing block D3 in the same manner as the accessory facility installation region 91 and extends from the lower portion of the lower processing block G1 to the upper portion of the upper processing block G2. The upper side of the accessory facility installation region 92 forms a region in which various electrical facilities (electrical machines) for operating respective processing modules in the processing blocks in each of which the accessory facility installation region 92 is provided are installed. The lower side of the accessory facility installation region 92 forms a region for installing a bottle for liquid processing like the support base 12 of the carrier block D1 described above, and a coating liquid is supplied from the bottle to each liquid processing module in the processing block provided with the accessory facility installation region 92.

The processing blocks D21, D22, D31, and D32 are the same in terms of the layout of the liquid processing module, the rear processing part 50, and the accessory facility installation regions 91 and 92, except that the second lower processing block D31 does not include a liquid processing module. As illustrated in FIGS. 3 and 6, an SCPL3 and an SCPL4 are provided at positions in the vicinity of the upper left end of the transport region 53 in the second upper processing block D32. In addition, an SCPL2 is provided at a position in the vicinity of the lower left end of the transport region 53 in the second lower processing block D31.

A TRS11 and a TRS12 are provided between the SPCL2 and the SCPL3 and SPCL 4, wherein the TRS11, which is the first substrate placement part, and the TRS12, which is the second substrate placement part, are located in the second lower processing block D31 and the second upper processing block D32, respectively. These SCPL2 to SCPL4, TRS11, and TRS12 overlap in a plan view to form a stacked body, and the stacked body is located to be sandwiched between the accessory facility installation regions 91 and 92 in the front-rear direction.

A lifting and transferring mechanism 7 configured to transport a wafer W from the TRS11 to the TRS12, that is, from the second lower processing block D31 to the second upper processing block D32, is provided at the front side of the accessory facility installation region 92. Hereinafter, the lifting and transferring mechanism 7 will be described with reference to the side view of FIG. 7 and the plan view of FIG. 8. The lifting and transferring mechanism 7 includes, for example, two columns 72, a rotation shaft 73, a support part 74, and a rotation mechanism 75. The two columns 72 are arranged in the left-right direction at positions close to the accessory facility installation region 92 (that is, the rear end of the transport region 53) in front of the accessory facility installation region 92, and each of the two columns 72 extends in the vertical direction.

The rotation shaft 73 extends horizontally from one support column 72 toward the other support column 72, that is, in the lateral direction, and the rotation mechanism 75 is connected to one end of the rotation shaft 73. The rotation mechanism 75 includes a motor or the like and rotates the rotation shaft 73 around an axis. The other end of the rotation shaft 73 is connected to, for example, a bearing 76. The rotation mechanism 75 and the bearing 76 are provided inside, for example, the support columns 72, respectively, and the support columns 72 are configured as an elevating mechanism that vertically raises and lowers both the rotation mechanism 75 and the bearing 76.

Figure 7:
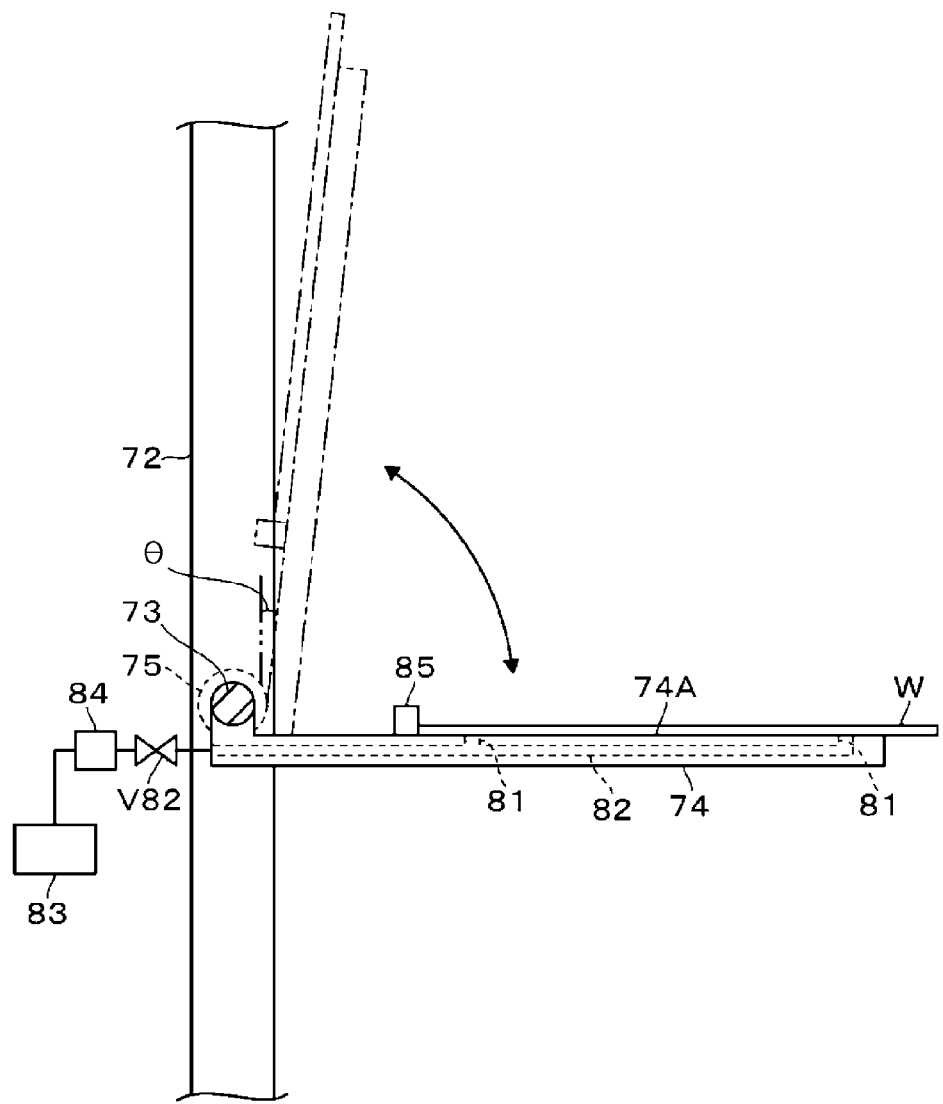
FIG. 7 is a side view illustrating a lifting and transferring mechanism provided in the substrate processing apparatus.

As illustrated by the solid lines in FIG. 7, the plate-shaped support part 74 is formed to extend horizontally from the rotation shaft 73 to the front side (one side in the front-rear direction). Therefore, the support part 74 is provided to extend in a direction intersecting the axial direction of the rotation shaft 73. The support part 74 is bifurcated in the middle of extension to form a symmetrical fork shape. Regarding the support part 74, the tip end portions branched in that way are denoted by reference numeral 77, and a base portion closer to the rotation shaft 73 than the tip end portions 77 is denoted by reference numeral 76. The top surface of the support part 74 forms a support surface 74A that faces and supports the bottom surface (rear surface) of a wafer W.

Assuming that the orientation of the support part 74 described above is a first orientation, the support surface 74A is horizontal at the first orientation to support the wafer W horizontally. The support part 74 is rotated around the rotation shaft 73 by the rotation mechanism 75 to be in a second orientation in which the support part 74 is positioned such that the tip end side thereof is directed upward, as illustrated by the chain lines in FIG. 7. Therefore, with respect to the support surface 74A, the base end side (the rotation shaft 73 side) is located below the tip end side. In this way, the orientation of the support part 74 is switched between the first orientation and the second orientation. When the support part 74 is in the second orientation in this way, the support surface 74A is tilted such that the tip end side thereof is located slightly closer to the front side than the base end side. Therefore, the support surface 74A is tilted with respect to the vertical plane (indicated by the alternate long and two short dash lines in FIG. 7), and the slope θ of the support surface 74A with respect to the vertical surface is, for example, 30 degrees or less in order to transport a wafer W, as described later.

In the support surface 74A, a suction hole 81 for suctioning the peripheral edge of the rear surface of a wafer W is open in each of the tip end portions 77 and the base portion 76, and the support surface 74A is capable of holding the wafer W even when the support part 74 is in the second orientation described above. As illustrated in FIG. 7, each suction hole 81 is connected to a suction path 82 formed inside the support part 74, and the downstream side of the suction path 82 extends to the outside of the support part 74 and is connected to the suction part 83 that evacuates the suction path 82. Outside the support part 74, a valve V82 is interposed in the suction path 82. By opening and closing the valve V82, switching is performed between the suction state and the non-suction state from the suction hole 81. When the rear surface of a wafer W is supported by the support part 74, the wafer W is brought into a suction state so that the wafer W is held on the support surface 74A.

In addition, the suction path 82 is provided with a pressure detector 84, and a detection signal corresponding to the pressure of the suction path 82 is transmitted to the controller 10 to be described later. Based on the detection signal, the controller 10, which is a holding abnormality detector, determines the presence or absence of the holding abnormality of a wafer W. More specifically, when the valve V82 is opened and the suction state is reached as described above, if the wafer W is not normally supported due to falling off from the support part 74 or the like, the detected pressure becomes relatively high due to the suction of gas from the suction hole 81. Therefore, the presence or absence of the above abnormality can be determined by comparing the detected pressure value with a preset threshold value.

In addition, a fall prevention portion 85 is formed on the base portion 76 of the support part 74. The fall prevention portion 85 is formed by protruding the outer region of the support surface 74A of the support part 74 with respect to the support surface 74A, and when the support part 74 is in the second orientation, the fall prevention portion 85 is located below the wafer W. Due to the provision of the fall prevention portion 85, and the fact that the support surface 74A is tilted with respect to the vertical plane when the support surface 74A is in the second orientation as described above, even when a problem occurs in suction from the suction holes 81, the wafer W is prevented from slipping toward the base end side of the support part 74 and falling from the support part 74 to be damaged.

Figure 8:
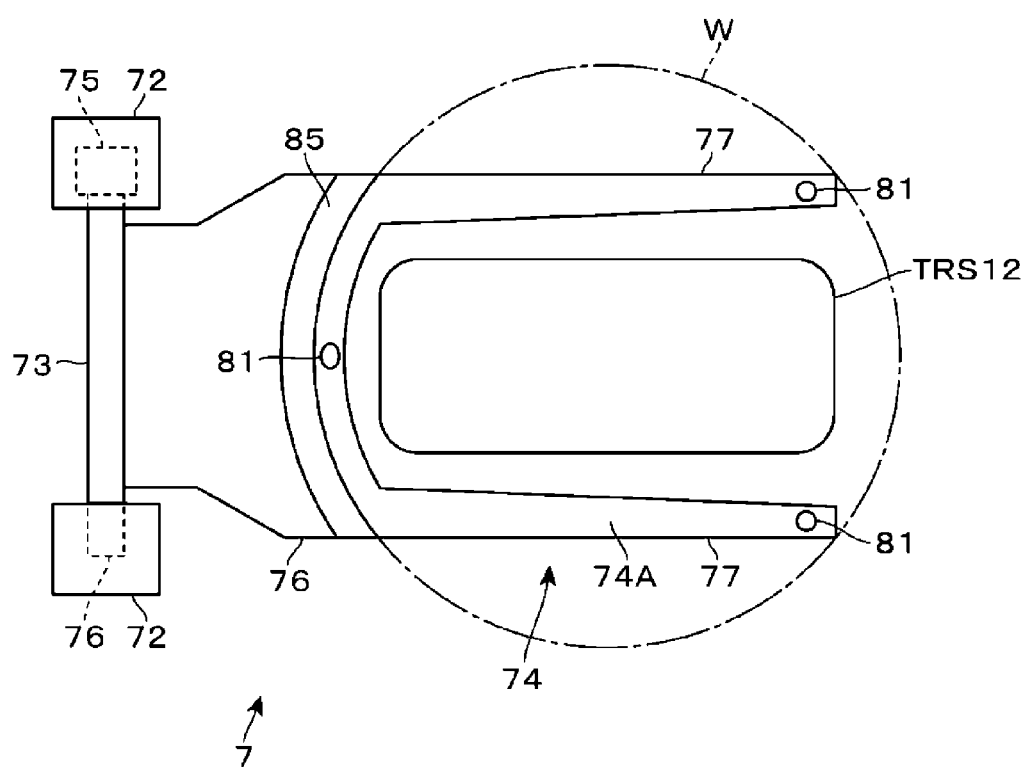
FIG. 8 is a plan view illustrating the lifting and transferring mechanism.

The above-mentioned TRS11 and TRS12 for the lifting and transferring mechanism 7 will be further described with reference to FIG. 8. The TRS11 and TRS12 are configured to be positioned within a recess surrounded by the two tip end portions 77 and the base portion 76 in a plan view and to support the central portion of a wafer W when the support part 74 of the lifting and transferring mechanism 7 is turned into the above-mentioned horizontal first orientation. Only the TRS12 is representatively illustrated in FIG. 8. With such a configuration, each of the TRS11 and the TRS12 is capable of delivering a wafer W to the support part 74, which is turned into the first orientation and moves upward and downward, without interfering with the support part 74.

Figure 9:
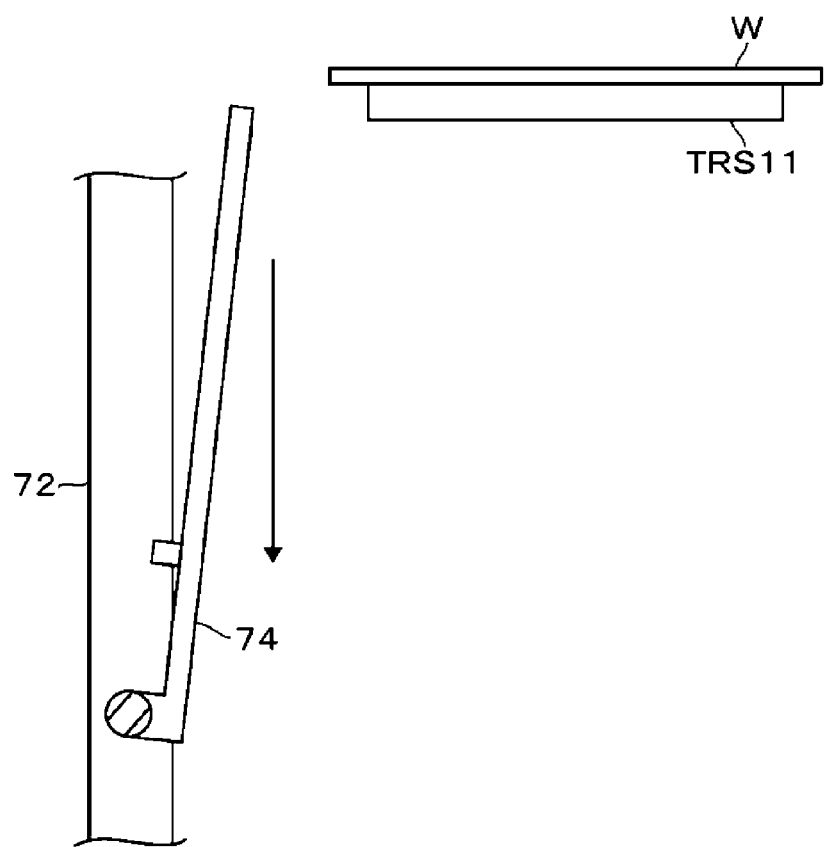
FIG. 9 is an explanatory view illustrating an operation of the lifting and transferring mechanism.
Figure 10:
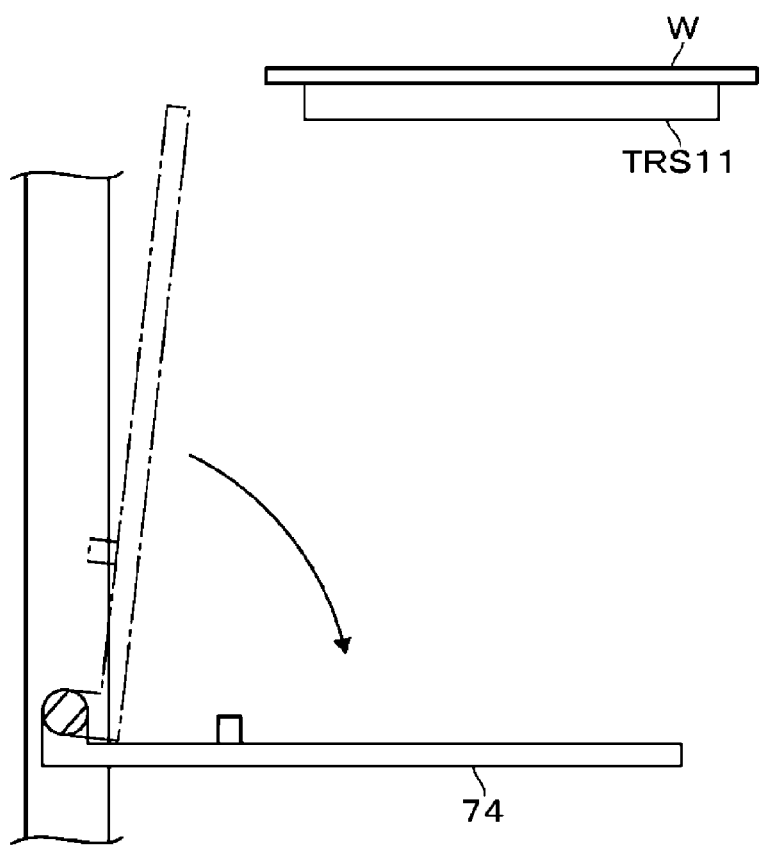
FIG. 10 is an explanatory view illustrating an operation of the lifting and transferring mechanism.
Figure 11:
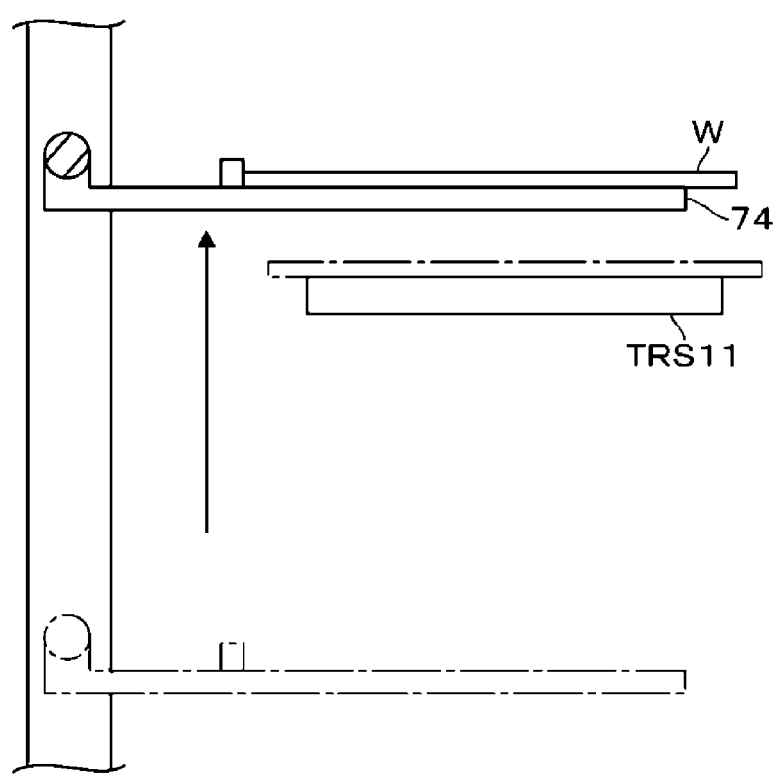
FIG. 11 is an explanatory view illustrating an operation of the lifting and transferring mechanism.

Subsequently, the transport of a wafer W by the lifting and transferring mechanism 7 will be described step by step with reference to FIGS. 9 to 14. The support part 74 having the tip ends directed upward in the second orientation moves from a position above the TRS11 on which a wafer W is placed toward a position below the TRS11. By being in the second orientation in that way, the support part 74 does not interfere with the wafer W (FIG. 9). Then, the support part 74 is turned into the horizontal first orientation (FIG. 10). It is assumed that the support part 74 is lowered to a position at which the support part 74 does not interfere with the wafer W due to this change in orientation. Next, by moving the support part 74 from a position below the TRS11 on which the wafer W is placed to a position above the TRS11, the wafer W is delivered from the TRS11 to the support part 74 (FIG. 11).

Figure 12:
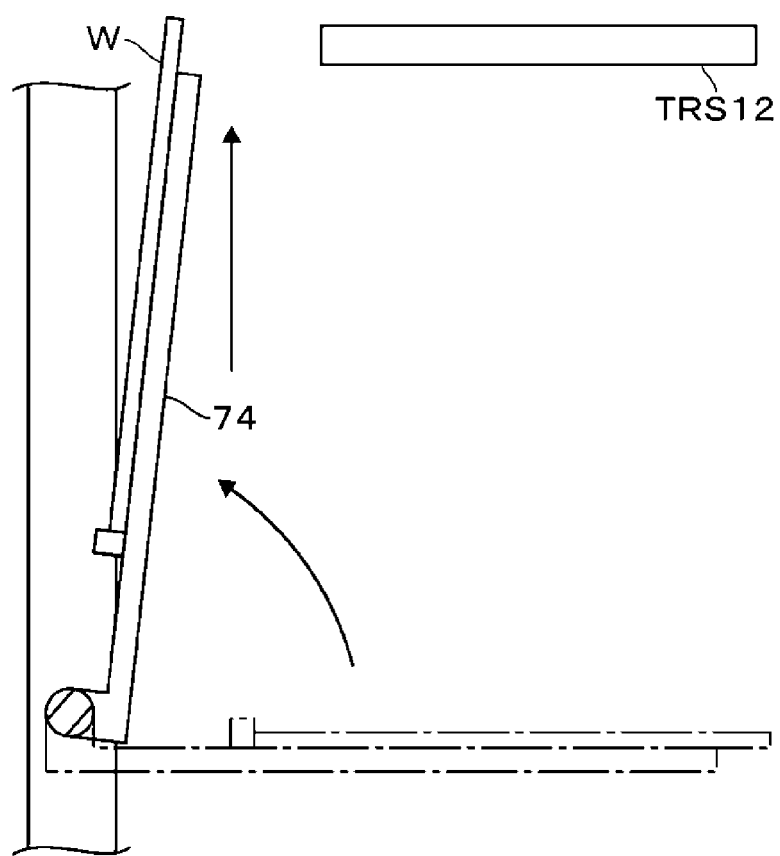
FIG. 12 is an explanatory view illustrating an operation of the lifting and transferring mechanism.
Figure 13:
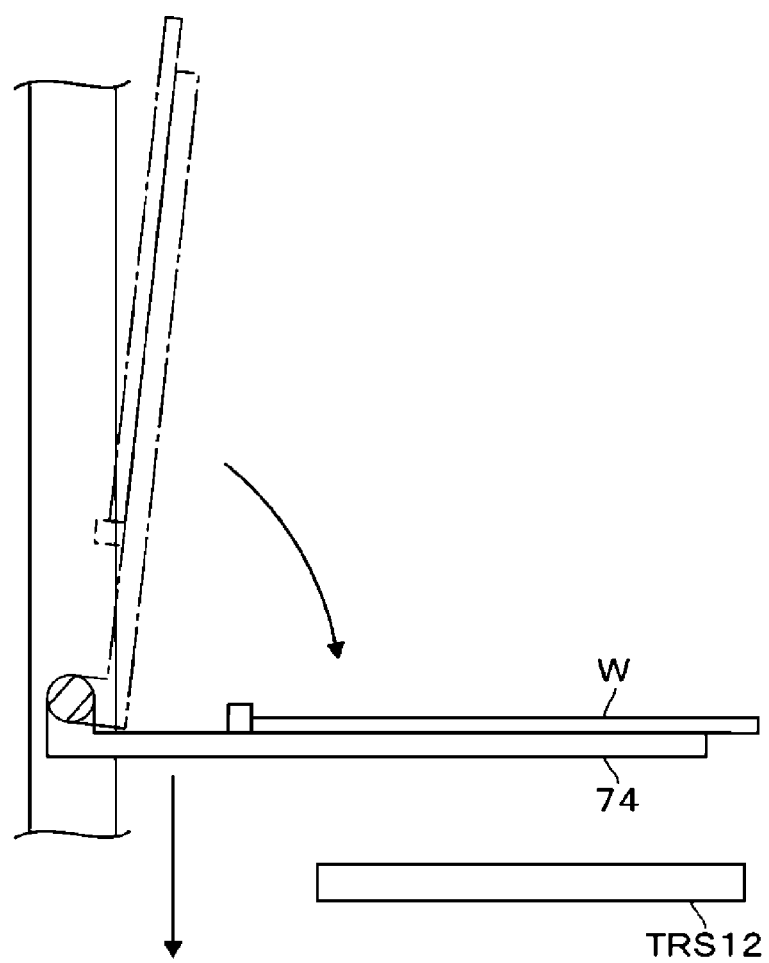
FIG. 13 is an explanatory view illustrating an operation of the lifting and transferring mechanism.
Figure 14:
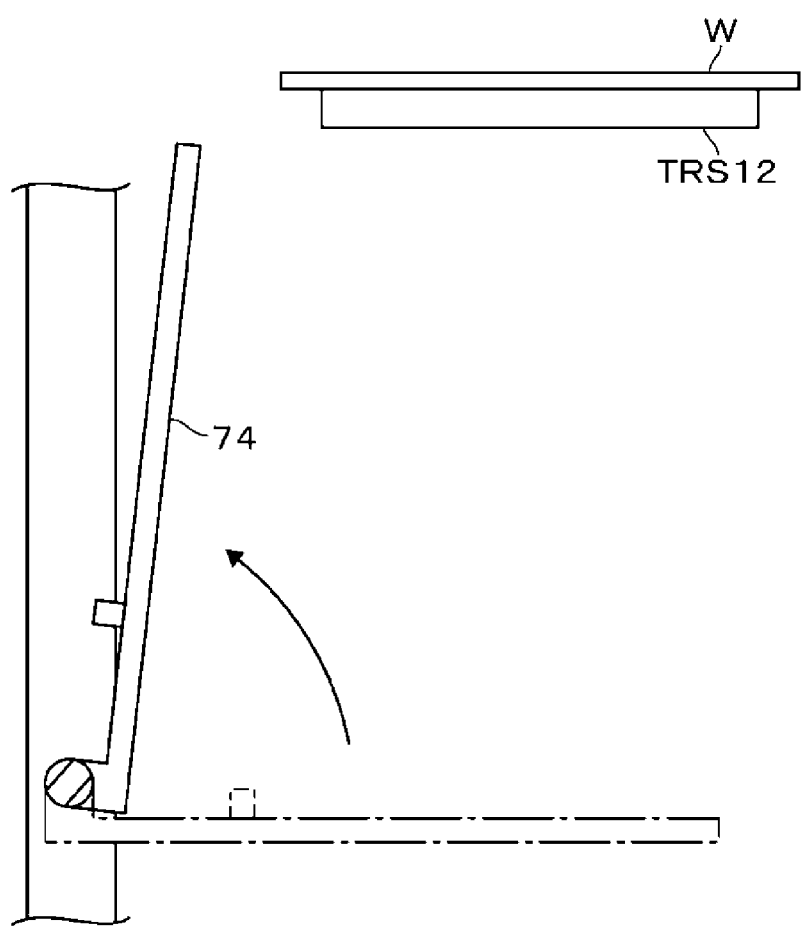
FIG. 14 is an explanatory view illustrating an operation of the lifting and transferring mechanism.

Subsequently, the support part 74 is turned into the second orientation and is moved above the TRS12. At this time, since the support part 74 is in the second orientation, the wafer W held by the support part 74 and the TRS12 do not interfere with each other (FIG. 12). Thereafter, the support part 74 is turned into the first direction (FIG. 13), the support part 74 is moved from a position above the TRS12 to a position below the TRS12, and the wafer W is delivered from the support part 74 to the TRS12. Thereafter, the support part 74 is turned into the second orientation and is moved downward (FIG. 14). The support part 74 is lowered to a position at which the support part does not interfere with the wafer W placed on the TRS12 due to this change in orientation. In addition, the change in orientation is performed above the TRS11 such that the support part 74 does not interfere with the subsequent wafer W placed on the TRS11. The height position of the TRS11 corresponds to a first position, and the height position of the TRS12 corresponds to a second position.

Thereafter, the lifting and transferring mechanism 7 repeats the operations illustrated in FIGS. 9 to 14, and sequentially transports the wafers W transported to the TRS11 to the TRS12. The suction from the suction holes 81 in the support part 74 and the detection of the pressure in the suction path 82 are performed during a period between the time at which the support part 74 receives a wafer W from the TRS11 and the time at which the wafer W is delivered to the TRS12.

The substrate processing apparatus 1 includes a controller 10 (see FIG. 1). The controller 10 is configured with a computer, and includes a program, a memory, and a CPU. The program incorporates a group of steps such that a series of operations in the substrate processing apparatus 1 can be implemented. The presence or absence of an abnormality in holding the wafer W is detected. Based on the program, the controller 10 outputs a control signal to each part of the substrate processing apparatus 1 so as to control the operation of each part. Specifically, the operations of the transport mechanisms 6A to 6D, the lifting and transferring mechanism 7, and each processing module are controlled. As a result, transportation of the wafer W and processing of the wafer W to be described later are performed. In addition, with the program, detection of the presence or absence of a holding abnormality based on the pressure of the suction path 82 described above and detection of an abnormality based on an acquired wafer W image are performed. The above-mentioned program is stored in a non-transitory storage medium such as a compact disc, a hard disc, or a DVD, and is installed in the controller 10.

Each processing module of the first lower processing block D21 (one left processing block) and the second lower processing block D31 (one right processing block) is the first processing module, and the chemical liquid coating module 47, which forms an underlayer film (a first coating film), is a first coating film forming module. The heating modules 54 in the processing blocks D21 and D31, each of which heats a wafer W on which the underlayer film is formed, are first heating modules. The transport mechanisms 6A and 6C in these processing blocks D21 and D31 are first transport mechanisms, and the transport region 53 in these processing blocks D21 and D31 is a first transport region. Each processing module of the first upper processing block D22 (another left processing block) and the second upper processing block D32 (another right processing block) is a second processing module. The chemical liquid coating module 48 and the resist coating module 51, which form an interlayer film and a resist film (a second coating film), are second coating film forming modules, and the heating modules 54 in the processing blocks D22 and D32, each of which heats a wafer W on which the interlayer film and the resist film are formed, are second heating modules. The transport mechanisms 6B and 6D in these processing blocks D22 and D32 are second transport mechanisms, and the transport region 53 in these processing blocks D22 and D32 is a second transport region.

The first lower processing block D21 and the first upper processing block D22 forming the first processing block D2 will be referred to as one set of processing blocks, and the second lower processing block D31 and the second upper processing block D32 forming the second processing block D3 will be referred to as another set of processing blocks. As described above, the carrier block D1 is provided along the arrangement of these sets, and the lifting and transferring mechanism 7 is provided in another set (the second lower processing block D31 and the second upper processing block D32) among these sets, which is spaced farther apart from the carrier block D1. In the second lower processing block D31 and the second upper processing block D32, the front side of the position at which the rotation shaft 73 of the lifting and transferring mechanism 7 is provided is a transport region 53, and this transport region extends to the right side (one side in the left-right direction). Processing modules are provided along the extension direction of this transport region.

Figure 15:
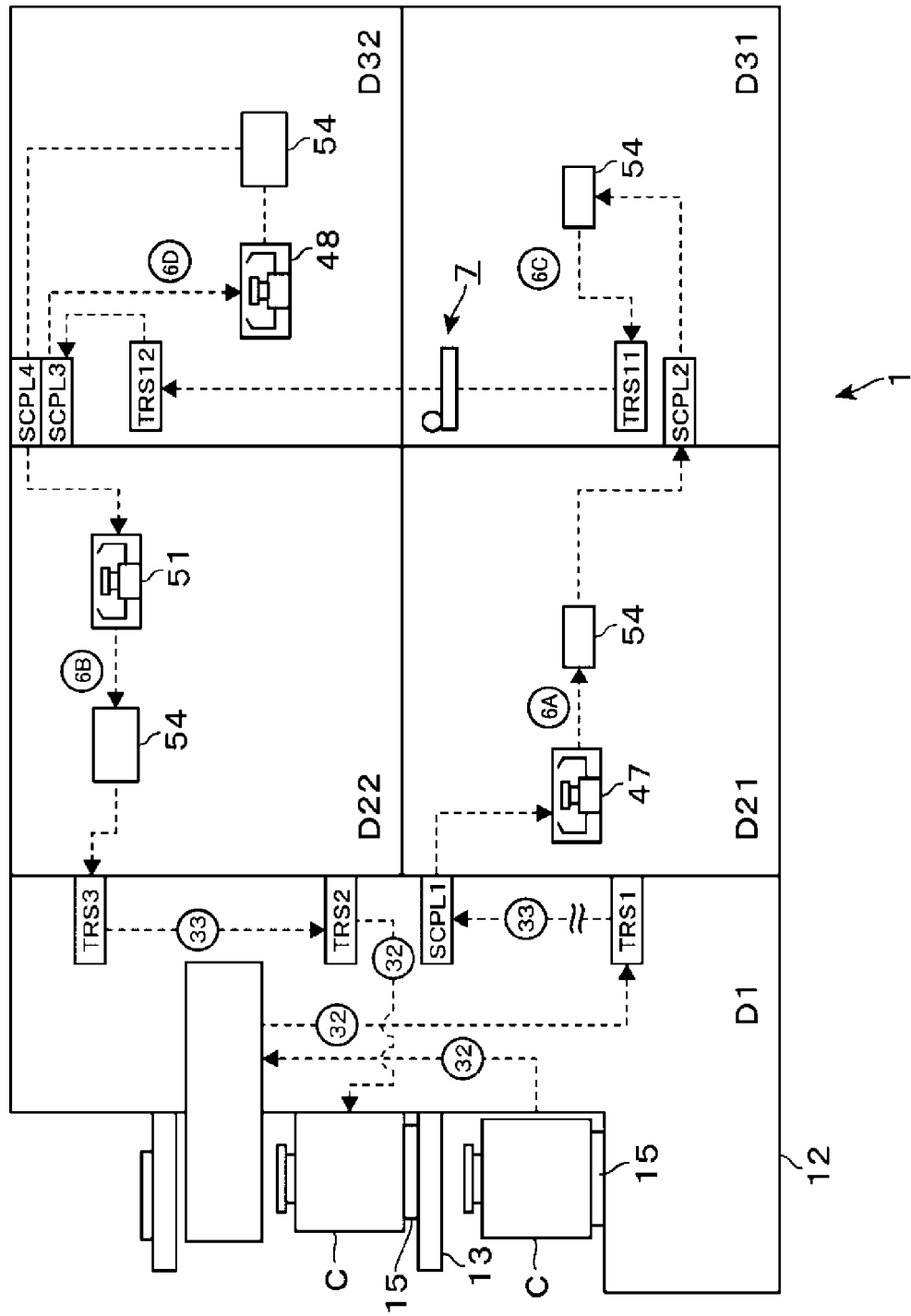
FIG. 15 is a schematic view illustrating a transport path in the substrate processing apparatus.

Subsequently, processing and transportation of a wafer W in the substrate processing apparatus 1 will be described with reference to FIG. 15 which illustrates the outline of a transport path. In FIG. 15, the transport mechanisms used for transportation are indicated on or near some of the arrows representing the transportation of a wafer W among the modules. First, a wafer W is carried out by the transport mechanism 32 from a carrier C placed on a moving stage 15 of the support base 12, the wafer W is transported to the pre-processing inspection module 41 to acquire image data and to determine the presence or absence of an abnormality, and then the wafer W is transported to the TRS1. Thereafter, the wafer W is transported to the hydrophobic processing module 30 by the transport mechanism 33, is subjected to a hydrophobic process, and is then transported to the SCPL1. Subsequently, the wafer W is carried into the first lower processing block D21 by the transport mechanism 6A and is transported in the order of the chemical liquid coating module 47 and the heating module 54 so that an underlayer film is formed thereon. In that state, the wafer is transported to the SPCL2 in the second lower processing block D31.

Thereafter, the wafer W is transported to the heating module 54 in the second lower processing block D31 by the transfer mechanism 6C to be subjected to heat treatment. Then, the wafer W is transported to the TRS11, and as described with reference to FIGS. 9 to 14, the wafer is transported to the TRS12 in the second upper processing block D32 by the lifting and transferring mechanism 7. Then, the wafer W is transported in the order of the SCPL3, the chemical liquid coating module 48, and the heating module 54 by the transport mechanism 6D in the second upper processing block D32. Then, the wafer W is transported to the SCPL4 in the state in which an interlayer film is formed thereon.

Then, the wafer W is carried into the first upper processing block D22 by the transport mechanism 6B and is transported in the order of the resist coating module 51 and the heating module 54. Then, the wafer W is transported to the TRS3 in the carrier block D1 in the state in which the resist film is formed thereon. Thereafter, the wafer W is transported in the order of the transport mechanism 33, the TRS2, the transport mechanism 32, and is stored in the carrier C on the moving stage 15 of the support base 13.

As described above, the substrate processing apparatus 1 is provided with the lifting and transferring mechanism 7 for transporting a wafer W from the second lower processing block D31 to the second upper processing block D32. Then, the support part 74 of the lifting and transferring mechanism 7 that holds the wafer W rotates to switch the orientation between the horizontal first orientation and the erected second orientation. Let's suppose that instead of the lifting and transferring mechanism 7, a transport mechanism in which a holding part for the wafer W is capable of moving forward and rearward with respect to a base and the base is capable of moving upward and downward (that is, a transport mechanism similar to the transfer mechanism 6A to 6D and the like) is provided to transport a wafer W between the TRS11 and the TRS12. In that case, it is necessary to provide an elevating space for the transport mechanism at the front side or the rear side with respect to the TRS11 and the TRS12, and the front-rear width of the elevating space should be a size corresponding to the front-rear width of the transport mechanism. Therefore, in order to secure the elevating space, the rear processing part 50 and the accessory facility installation region 92 or the chemical liquid coating module 48 and the accessory facility installation region 91 should be disposed to be shifted to the right side by the left-right width of the elevating space from the positions described above. Therefore, the left-right length of the second processing block D3 increases, and the floor area (footprint) occupied by the substrate processing apparatus 1 increases.

However, since the lifting and transferring mechanism 7 has a configuration in which the support part 74 rotates as described above, the front-rear width required to avoid interference with the wafer W placed on each TRS11 is suppressed, it is possible to install the lifting and transferring mechanism 7 by using the space at the front side of the accessory facility installation region 92. Therefore, with the substrate processing apparatus 1, since the left-right length of the second processing block D3 provided with the lifting and transferring mechanism 7 is suppressed, it is possible to reduce the floor area occupied by the substrate processing apparatus 1. In addition, the fact that the occupied floor area is suppressed as described above in installing the substrate processing apparatus 1 in a limited space means that it is possible to install the substrate processing apparatus 1 in that space without reducing the number of processing modules equipped in the substrate processing apparatus 1. Therefore, with the substrate processing apparatus 1, it is possible to achieve effects of securing a sufficient number of processing modules and preventing reduction in throughput.

In addition, by providing the above-mentioned lifting and transferring mechanism 7 as a dedicated transport mechanism between the lower processing block (one processing block) G1 and the upper processing block G2 (another processing block), the load on the transport mechanisms 6A to 6D of respective processing blocks is suppressed. Therefore, since the transfer mechanisms 6A to 6D are capable of quickly delivering wafers W to a plurality of processing modules, which are provided in each processing block, it is possible to obtain a high throughput for the substrate processing apparatus 1 from that point of view as well.

As described above, the lifting and transferring mechanism 7 is provided at the front side of the accessory facility installation region 92 in the transport region 53. That is, the lifting and transferring mechanism is provided to face the region in which no processing module is provided. With such an arrangement, since the number of installed processing modules is not reduced by providing the lifting and transferring mechanism 7, reduction in throughput is more reliably prevented.

The lifting and transferring mechanism 7 performs only the elevating operation and the rotating operation. Thus, as described above, compared with the case in which a transport mechanism having the same configuration as the transport mechanism 6A to 6D is provided instead of the lifting and transferring mechanism 7, the driving mechanism is simple. Therefore, it is possible to achieve the reduction in the manufacturing cost of the apparatus.

The second orientation is not limited to making the tip end of the support part 74 directed upward, but may include making the tip end directed downward. However, with the configuration in which the tip end of the support part 74 is directed upward, a wafer W slides down toward the rear support column 72 side even if there is a problem in suction from the suction holes 81, so that the wafer W will be supported by the support column 72. Therefore, it is possible to prevent the wafer W from being damaged by dropping onto the floor of the processing block. As described above, since the fall prevention portion 85 is provided in this example, the wafer W is more reliably prevented from being damaged due to falling.

When the wafer W is transported from the second lower processing block D31 to the second upper processing block D32 as described above, a liquid processing module may also be disposed in the second lower processing block D31, so that the wafer W may be transported to the second upper processing block D32 after being processed with the liquid processing module. In addition, only one of the first lower processing block D21 and the second lower processing block D31 may be provided with the heating module 54. In that case, after an underlayer film is formed in the chemical liquid coating module 47 of the first lower processing block D21, the wafer W may be processed only once in the heating module 54 and may be transported to the upper processing block G2 by the lifting and transferring mechanism 7. When the heating module 54 is provided only in the first lower processing block D21, the region provided with the heating module 54 in the second lower processing block D31 may be used as a region for installing accessory facilities.

The substrate processing apparatus may be configured such that each module described as being provided in the lower processing block G1 is provided in the upper processing block G2 and each module described as being provided in the upper processing block G2 is provided in provided in the lower processing block G1. That is, in the substrate processing apparatus, a wafer W is transported using the upper processing block G2 as an outward path and the lower processing block G1 as a return path, and the lifting and transferring mechanism 7 transfers the wafer W from the TRS12 to the TRS11. Therefore, the lifting and transferring mechanism 7 may be configured to transport the wafer W from above to below. The module to which the lifting and transferring mechanism 7 delivers a wafer W is not limited to a TRS and may be configured to deliver a wafer W to, for example, an SCPL. In addition, the lifting and transferring mechanism 7 is not limited to the configuration in which a wafer W is delivered to a module, and a wafer W may be delivered directly to, for example, the transport mechanisms 6B and 6D. However, it is considered that a waiting time during which transport mechanisms 6B and 6D cannot transport a wafer W becomes long in such delivery. Therefore, it is preferable for the lifting and transferring mechanism 7 to perform delivery to a module as described above.

Figure 16:
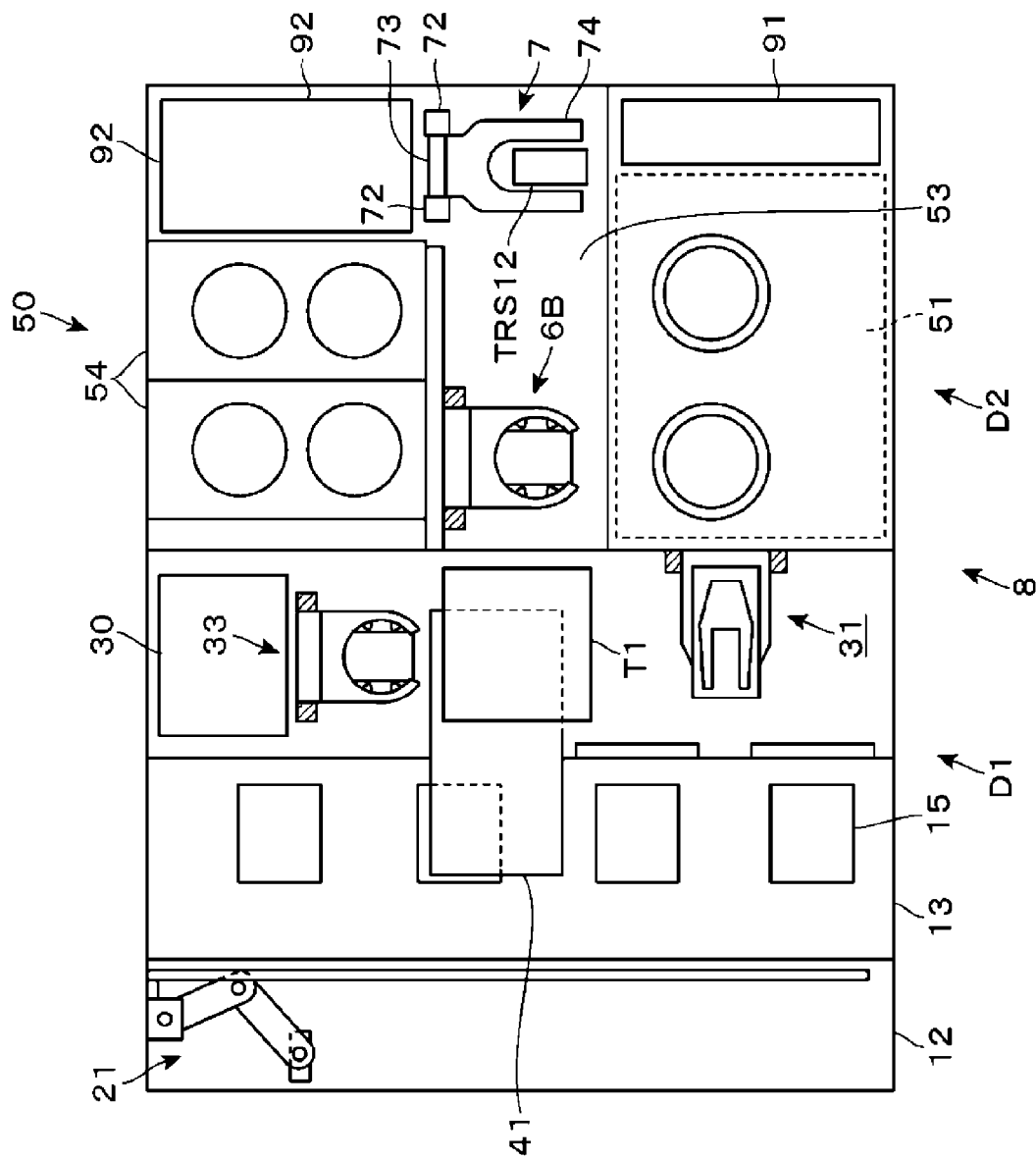
FIG. 16 is a horizontal sectional plan view of a substrate processing apparatus according to another example of the embodiment of the present disclosure.

The substrate processing apparatus may be configured not to include the second processing block D3 but to include only the first processing block D2. A substrate processing apparatus 8 having such a configuration will be described with reference to the plan view of FIG. 16 and the front view of FIG. 17. The substrate processing apparatus 8 forms an antireflection film and a resist film on a wafer W in this order in the first processing block D2, and the chemical liquid coating module 48 of the first lower processing block D21 supplies a chemical liquid for forming an antireflection film to a wafer W instead of a chemical liquid for forming an underlayer film.

In the substrate processing apparatus 8, the lifting and transferring mechanism 7 and the TRS11 and TRS12 are located at the right side of the rear processing part 50 so as not to interfere with the delivery of a wafer W among the module-stacked body T1 and the transport mechanisms 6A and 6B. According to such an arrangement, accessory facility installation regions 91 and 92 are also provided at the right end of the first processing block D2.

As in the substrate processing apparatus 1, in the substrate processing apparatus 8, a wafer W is transported from the carrier block D1 to the first lower processing block D21 via the SCPL1 of the module-stacked body T1, and the wafer W is transported in the order of the chemical liquid coating module 48 and the heating module 54 to form an antireflection film thereon. Then, the wafer W is transported to the first upper processing block D22 via the TRS11, the lifting and transferring mechanism 7, and the TRS12 in this order, and the wafer W is transported in the order of the SCPL, the resist coating module 51, and the heating module 54, which are provided at the height of the first upper processing block D22 in the module-stacked body T1, to form a resist film thereon. Thereafter, the wafer W is returned from the carrier block D1 to the carrier C in the same manner as in the substrate processing apparatus 1. As described above, the number of processing blocks connected in the left-right direction is not limited to two as the configuration of the apparatus. Then, the positions of the lifting and transferring mechanism 7 and the TRS11 and TRS12 for the lifting and transferring mechanism 7 may be appropriately set according to the configurations of processing blocks.

The lifting and transferring mechanism 7 is not limited to the configuration in which the support part 74 extends forward from the rotation shaft 73 as in the above-described example. As illustrated in FIG. 18, the support columns 72 may be provided in the vicinity of the accessory facility installation region 91 at the front side of the transport region 53, the rotation shaft 73 may extend in the left-right direction from the support columns 72, and the support part 74 may extend from the rotation shaft 73 to the rear side of the transport region 53. In the substrate processing apparatus 8 described above with reference to FIG. 17, the support columns 72 may be provided at the right end of the transport region 53, the rotation shaft 73 may extend from the support columns 72 in the front-rear direction of the transport region 53, and the support part 74 may extend from the rotation shaft 73 toward the left side.

In FIGS. 9 to 14, in a height region in the vicinity of the TRS11 (a first region) and a height region in the vicinity of the TRS12, the support part 74 is illustrated to be in the first orientation, and in the region between the first region and the second region, the support part 74 is illustrated to be in the second orientation. Even in this intermediate region, the support part 74 may be in the first orientation as long as the support part 74 does not interfere with the transportation of a wafer W. That is, the support part 74 is not limited to being kept in the second orientation while moving upward and downward between the TRS11 and the TRS12. When the inclination of the support surface 74A with respect to the horizontal plane is relatively small in the second orientation, a wafer W may be held by utilizing the frictional force between the support surface 74A and the rear surface of the wafer W without providing the suction holes 81. In addition, a plurality of pressing mechanisms are provided on the support part 74. Each pressing mechanism may be configured to press a wafer W from the outside of the wafer W toward the center side of the wafer W so that the wafer W is held by the support part 74 by the action of each pressing mechanism. Therefore, the support part 74 is not limited to the configuration in which the suction holes 81 are provided.

Although the first orientation of the support part 74 is horizontal, the orientation may be tilted with respect to the horizontal plane as long as a wafer W can be supported. A structure in which a wafer W is supported by being in contact with the top surface of the plate-shaped support part 74 has been illustrated. However, a support member for a wafer W may be provided on the top surface of the support part 74 such that this member faces and comes into contact with the bottom surface of a wafer W to support the wafer W. In that case, the member forms a support surface for a wafer W.

The liquid processing performed by the apparatus is not limited to the above-mentioned example, and a process of forming a coating film separate from the above-mentioned coating film by coating a chemical liquid, a process of coating an adhesive for bonding wafers W to each other, or a cleaning process for cleaning the front surface or rear surface of a wafer W by providing a cleaning liquid to the front surface or the rear surface of the wafer W may be included. In addition, a development process may be included. For example, after performing a post-exposure cleaning process in the lower processing block G1, a development process may be performed in the upper processing block G2. As the coating film, specifically, for example, an insulating film or a protective film laminated on the resist film may be formed. Regarding a processing module provided in the rear processing part 50, a module other than the heating module may be disposed. For example, a peripheral exposure module configured to expose the peripheral edge of a resist film may be provided, or an inspection module having the same configuration as the pre-processing inspection module 41 may be provided to inspect the surface of a wafer W after a film is formed.

The arrangement of the carrier block D1 and the processing blocks may be reversed in the left-right direction, and the layout of the components of each block may be reversed in the front-rear direction. It shall be understood that the embodiments disclosed herein are examples in all respects and are not restrictive. The above-described embodiments may be omitted, replaced, modified, and combined in various forms without departing from the scope and spirit of the appended claims.

According to the present disclosure, a floor area occupied by a substrate processing apparatus can be suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a carrier block on which a carrier configured to store a substrate is placed;
a first processing block including a plurality of first processing modules, each of which is configured to process the substrate, and a first transport mechanism shared by the plurality of first processing modules to transport the substrate, wherein the substrate is transported to the first processing block from the carrier block;
a second processing block including a plurality of second processing modules, each of which is configured to process the substrate, and a second transport mechanism shared by the plurality of second processing modules to transport the substrate, wherein the second processing block overlaps the first processing block and is configured to transport the substrate to the carrier block;
a lifting and transferring mechanism including a shaft extending in a horizontal direction and a support part including a support surface, which is configured to face and support the substrate, and extending from the shaft in a direction intersecting an extension direction of the shaft, wherein the lifting and transferring mechanism is configured to move the shaft and the support part upward and downward between a first position for delivering the substrate to the first transport mechanism and a second position for delivering the substrate to the second transport mechanism; and a rotation mechanism configured to rotate the support part around the shaft such that an orientation of the support part is changed between a first orientation for delivering the substrate at each of the first position and the second position and a second orientation in which the support surface has a lager slope with respect to a horizontal plane than a slope at the first orientation in order to move the support part between the first position and the second position.

2. The substrate processing apparatus of claim 1, wherein the first processing block includes a first substrate placement part on which the substrate is placed in order to deliver the substrate to the first transport mechanism, the second processing block includes a second substrate placement part on which the substrate is placed in order to deliver the substrate to the second transport mechanism, and the first position and the second position are positions at which the substrate is delivered to the first substrate placement part and the second substrate placement part, respectively.

3. The substrate processing apparatus of claim 1, wherein the second orientation is an orientation in which a base end side, which is a shaft side of the support surface, is located below a tip end side and is tilted with respect to a vertical surface.

4. The substrate processing apparatus of claim 3, wherein, in the support part, the base end side of the support surface protrudes with respect to the support surface to form a fall prevention portion to prevent the substrate from falling from the base end side of the support surface.

5. The substrate processing apparatus of claim 1, wherein a suction hole configured to suction and hold the substrate is open in the support surface.

6. The substrate processing apparatus of claim 5, further comprising:
a suction path connected to the suction hole;
a pressure detector configured to detect a pressure of the suction path; and
a holding abnormality detector configured to detect presence or absence of an abnormality in holding the substrate based on the detected pressure.

7. The substrate processing apparatus of claim 1, wherein the support part extends from the shaft to one side in a front-rear direction,
a first transport region in which the substrate is transported by the first transport mechanism is located at one side in the front-rear direction with respect to the shaft and extends to one side in a left-right direction, wherein each of the first processing modules is provided in an extension direction of the first transport region, and
a second transport region in which the substrate is transported by the second transport mechanism is located at the one side in the front-rear direction with respect to the shaft and extends to the one side in the left-right direction, wherein each of the second processing modules is provided in an extension direction of the second transport region.

8. The substrate processing apparatus of claim 7, wherein an accessory facility for the first processing modules or an accessory facility for the second processing modules is provided at the other side in the front-rear direction with respect to the shaft.

9. The substrate processing apparatus of claim 1, wherein the first processing block includes a first left processing block and a first right processing block each of which includes the plurality of first processing modules and the first transport mechanism, wherein the first left processing block and the first right processing block are arranged in the left-right direction so that the substrate can be delivered to each other, the second processing block includes a second left processing block and a second right processing block each of which includes the plurality of second processing modules and the second transport mechanism, wherein the second left processing block and the second right processing block are arranged in the left-right direction so that the substrate can be delivered to each other, and the first left processing block and the second left processing block overlap each other, and the first right processing block and the second right processing block overlap each other.

10. The substrate processing apparatus of claim 9, wherein the carrier block is provided along an arrangement direction of a first set configured with the first left processing block and the second left processing block and a second set configured with the first right processing block and the second right processing block, and the lifting and transferring mechanism is provided in a set among the first set and the second set, which is spaced farther apart from the carrier block.

11. The substrate processing apparatus of claim 1, wherein the plurality of first processing modules include a first coating film forming module configured to form a first coating film by supplying a coating liquid to the substrate and a first heating module configured to heat the substrate on which the first coating film is formed, and the plurality of second processing modules include a second coating film forming module configured to form a second coating film on the first coating film by supplying a coating liquid to the substrate and a second heating module configured to heat the substrate on which the second coating film is formed.

12. A substrate processing method comprising:
placing a carrier configured to store a substrate on a carrier block;
transporting the substrate from the carrier block to a first processing block including a plurality of first processing modules, each of which is configured to process the substrate, and a first transport mechanism shared by the plurality of first processing modules to transport the substrate;
transporting the substrate to the carrier block from a second processing block including a plurality of second processing modules, each of which is configured to process the substrate, and a second transport mechanism shared by the plurality of first processing modules to transport the substrate, wherein the second processing block overlaps the first processing block;
moving upward and downward a lifting and transferring mechanism between a first position for delivering the substrate to the first transport mechanism and a second position for delivering the substrate to the second transport mechanism, wherein the lifting and transferring mechanism includes a shaft extending in a horizontal direction and a support part including a support surface, which is configured to face and support the substrate, and extending from the shaft in a direction intersecting an extension direction of the shaft;
rotating the support part around the shaft using a rotation mechanism; and
changing an orientation of the support part between a first orientation for delivering the substrate at each of the first position and the second position and a second orientation in which the support surface has a lager slope with respect to a horizontal plane than a slope at the first orientation so that the support part moves between the first position and the second position.

* * * * *